(12) United States Patent
Takahashi

(10) Patent No.: US 7,911,004 B2
(45) Date of Patent: Mar. 22, 2011

(54) SEMICONDUCTOR DEVICE AND MANUFACTURING METHOD OF THE SAME

(75) Inventor: Kensuke Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 248 days.

(21) Appl. No.: 12/305,900

(22) PCT Filed: Jun. 14, 2007

(86) PCT No.: PCT/JP2007/062015
§ 371 (c)(1),
(2), (4) Date: Dec. 19, 2008

(87) PCT Pub. No.: WO2007/148600
PCT Pub. Date: Dec. 27, 2007

(65) Prior Publication Data
US 2010/0181624 A1    Jul. 22, 2010

(30) Foreign Application Priority Data
Jun. 19, 2006  (JP) .................... 2006-169151

(51) Int. Cl.
*H01L 21/70* (2006.01)
(52) U.S. Cl. .......... 257/377; 257/E29.156; 438/649
(58) Field of Classification Search .......... 257/382, 257/383, 754–757, 768–770, E29.156, E21.006; 438/649
See application file for complete search history.

(56) References Cited

U.S. PATENT DOCUMENTS

| 4,786,611 A | 11/1988 | Pfiester |
| 2002/0093051 A1 | 7/2002 | Nohsoh et al. |
| 2007/0069304 A1 | 3/2007 | Aida et al. |

FOREIGN PATENT DOCUMENTS

| JP | 8-130216 | 5/1996 |
| JP | 9-82810 | 3/1997 |
| JP | 2002-217310 | 8/2002 |
| JP | 2006-108469 | 4/2006 |
| JP | 2007-88372 | 4/2007 |
| KR | 1020010064414 | 7/2001 |
| WO | WO 2006/001271 | 1/2006 |

OTHER PUBLICATIONS

International electron devices meeting technical digest, 2002, p. 35.
International electron devices meeting technical digest, 1985, p. 41.
International electron devices meeting technical digest, 2002, p. 24.
International electron devices meeting technical digest, 2003, p. 31.
International electron devices meeting technical digest, 2004, p. 91.
Korean Offical Action - 10-2008-7031065 - Oct. 28, 2010.

*Primary Examiner* — Evan Pert
*Assistant Examiner* — Matthew Reames
(74) *Attorney, Agent, or Firm* — Young & Thompson

(57) ABSTRACT

A semiconductor device includes a gate electrode line provided to extend from an N-type area through a device isolation area to a P-type area, and source/drain diffused regions formed in N-type and P-type areas. The gate electrode line includes a first silicide region which configures a P-type MOSFET gate electrode and includes therein a silicide of metal M1, a second silicide region which configures an N-type MOSFET gate electrode and includes therein a silicide of metal M2, and an impurity-doped silicon region which is provided on a device isolation area and includes therein impurities at a higher concentration than both the gate electrodes.

19 Claims, 15 Drawing Sheets

N-type MOSFET

P-type MOSFET

US 7,911,004 B2

SEMICONDUCTOR DEVICE AND MANUFACTURING METHOD OF THE SAME

TECHNICAL FIELD

The present invention relates to a semiconductor device that includes an N-type MOSFET (metal oxide semiconductor field effect transistor) and a P-type MOSFET, and a manufacturing method of the same. In particular, the present invention relates to a technique for achieving higher performance and higher reliability of a semiconductor device wherein each-type MOSFET includes a gate insulation film including a higher-permittivity insulation film, and uses different silicide materials having different compositions for the N-type MOSFET and P-type MOSFET.

BACKGROUND ART

In development of advanced CMOS (complementary MOS) devices wherein transistors have increasingly smaller dimensions, there is the problem of degradation in the driving current due to depletion of a polycrystalline silicon (poly-Si) electrode and increase in the gate leakage current caused by a smaller thickness of the gate insulation film. Thus, a hybrid technology is investigated which can avoid depletion of the gate electrode by application of a metal gate electrode, and at the same time, reduce the gate leakage current by using a higher-permittivity material for the gate insulation film to increase the physical film thickness thereof.

Pure metal, metal nitride, silicide material etc. have been examined as the materials for use in the metal gate electrode. Use of either material requires that:
(1) threshold voltage (Vth) of the N-type MOSFET and P-type MOSFET be set at a suitable value;
(2) degradation scarcely occurs in the gate insulation film upon forming the metal gate electrode; and
(3) resistivity of the gate electrode be lower.

As to the above item (1), in order to achieve a lower-power-consumption device among other advanced CMOS devices, in particular, it is necessary to set the threshold voltage (Vth) of the CMOS transistors configuring the device within a range of ±0.25V and ±0.5V. For achieving this Vth, the gate electrode material configuring the N-type MOSFET should be a material having a work function which is equal to or below the mid gap (4.6 eV) of Si, and preferably between 4.5 eV and 4.3 eV, whereas the gate electrode material configuring the P-type MOSFET should be a material having a work function which is above the mid gap (4.6 eV) of Si, and preferably between 4.7 eV and 4.9 eV.

In view of the above, there is a proposed technique (dual-metal gate technique) as a countermeasure that different metals or alloys having different work functions be used separately for the N-type MOSFET gate electrode and P-type MOSFET gate electrode to control the Vth of the transistors.

As a semiconductor device using the dual-metal gate technique, a first literature (International electron devices meeting technical digest, 2002, p. 35), for example, discloses a semiconductor device wherein gate electrodes configured by Ta and Ru are formed on $SiO_2$. In the first literature, it is described that Ta and Ru have work functions of 4.15 eV and 4.95 eV, respectively, and that a modulation with 0.8 eV onto the work function is possible between both the gate electrodes, As another example of the semiconductor device using the dual-metal gate technique, there is technique wherein the same high-melting-point metal having an effective work function in the vicinity of the mid gap of silicon, or an alloy thereof is used as the gate electrode material of both-type MOSFETs, and the gate electrodes of the both-type MOSFETs include therein different impurities. In this metal gate technique, different kinds of impurities are added to a portion of the MOSFETs designed for the gate electrodes, and a high-temperature anneal process is subsequently performed, to thereby form different MOSFETs having different effective work functions. The feature of this metal gate technique is that a process similar to that used in the conventional technique can be used only by replacing polycrystalline silicon (polysilicon) by a high-melting-point metal or a silicide thereof.

As a semiconductor device using the above technique, a second literature (International electron devices meeting technical digest 1985, p. 41) and Patent Publication JP-1996-130216A describe that Mo silicide or W silicide including therein silicon (Si) in a content larger than a stoichiometric content is used, and B ions and As ions are implanted into the P-type MOSFET gate electrode and N-type MOSFET gate electrode, respectively, to control the effective work function in a range between 4.2 eV and 5.1 eV.

More recently, a full-silicidation technique for forming the gate electrodes attracts an attention, wherein a polysilicon gate pattern to be configured as the N-type MOSFET gate electrode and P-type MOSFET gate electrode is subjected to complete silicidation using a metal, such as Ni. The feature of this technique is that source/drain regions of the CMOS are formed, then thermally treated for activation of impurities, and thereafter, the polysilicon gate pattern is subjected to silicidation in a self-alignment manner. This allows the process to have a higher consistency with the conventional process.

A third literature (International electron devices meeting technical digest, 2002, p. 24) and a fourth literature (International electron devices meeting technical digest, 2003, p. 31) describe a semiconductor device using the above full-silicidation technology. More specifically, the third and fourth literatures disclose a technique wherein $SiO_2$ is used for the gate insulation film, a polysilicon gate pattern doped with impurities, such as P or B, is used as the gate electrode, which is subjected to complete silicidation using Ni to form Ni-silicide electrodes (P-doped NiSi for the N-type MOSFET gate electrode, and B-doped NiSi for the P-type MOSFET gate electrode), thereby achieving an effective work function modulated with 0.5 eV at a maximum.

A fifth literature (International electron devices meeting technical digest, 2004, p. 91) and Patent Publication WO 2006/001271 disclose a semiconductor device using a higher-permittivity insulation film made of HfSiON as the gate insulation film, as shown in FIG. 2, and using a gate electrode having a Ni-silicide crystal phase that is subjected to the complete silicidation. In this MOSFET, the effective work function is controlled by controlling the crystal phase (composition) of the Ni-silicide (phase-controlled Ni-full-silicidation technique), FIGS. 5A to 5I show the fabrication process described in WO 2006/001271. This fabrication process first forms source/drain regions 6 for the N-type MOSFET and P-type MOSFET in the semiconductor substrate 2, and a gate pattern 14 made of polysilicon and a mask layer 15 on the semiconductor substrate 2. FIG. 5A shows a top plan view thereof in this state, and FIGS. 5B, 5C and 5D show B-B' sectional view, C-C' sectional view and D-D' sectional view, respectively, taken in FIG. 5A.

Subsequently, an interlayer dielectric film 10 is formed on the entire surface, in the state shown in FIGS. 5A-5D. Thereafter, planarization of the interlayer dielectric film 10 is performed to expose the top portion of the mask layer 15, which is then removed to expose the polysilicon film 14 (FIGS. 5E and 5F).

Subsequently, a Ni film 16 is deposited on the entire surface, followed by providing a Ni-diffusion preventing film 18 on the gate pattern which is to be formed as the N-type MOSFET gate electrode, and depositing another Ni film 16 thereon (FIGS. 5G and 5H). Thereafter, an anneal process is performed for silicidation of the gate pattern 14, thereby forming MOSFET gate electrodes 8 and 9 (FIGS. 5I and 5J). At this stage, the Ni film 16 deposited on the diffusion preventing film 18 on the N-type MOSFET gate pattern 14 does not react with the polysilicon gate pattern, whereas the Ni film 16 deposited on the P-type MOSFET gate pattern 14 can react completely with the polysilicon gate pattern. As a result, the Ni that is deposited on the gate pattern to be formed as the N-type MOSFET gate electrode and the Ni that is deposited on the gate pattern to be formed as the P-type MOSFET gate electrode have different film thicknesses therebetween, whereby it is possible to make the Ni-silicide have different crystal phases.

Use of the above full-silicidation technology attains control of the effective work function in a wide range by providing different contents for the gate electrode material as shown in FIG. 3. It will be understood from FIG. 3 that the effective work function can be modulated in a range of about 0.4 eV by changing the gate electrode material from $NiSi_2$ through NiSi to $Ni_3Si$. More concretely, WO 20061001271 uses $Ni_3Si$ as the P-type MOSFET gate electrode material and $NiSi_2$ as the N-type MOSFET gate is electrode material, thereby setting the Vth of the CMOS transistor in a range of ±0.3V.

According to the analysis by the present inventor, there are some problems in the above conventional techniques, as described hereinafter. The dual-metal gate technique such as described in the first literature separately forms the both-type MOSFET gate electrodes to include different metals or alloys having different work functions. This requires etching of the gate pattern deposited on the gate insulation film for removal, to form different gate electrodes for respective types of MOSFET. For example, in order for depositing a metallic material for the N e MOSFET gate electrode after depositing another metallic material for the P-type MOSFET gate electrode on the entire wafer surface, it is necessary to remove by etching the metallic material for the P-type MOSFET gate electrodes already deposited on the N-type MOSFET gate pattern, while leaving the gate insulation film. This may result in degradation in the device characteristic or reliability due to the quality degradation of the gate insulation film occurring upon the etching for removal. In addition, it is difficult to develop an etching technique which has a sufficient etch selectivity for the two metallic materials used for the N-type MOSFET gate electrode and P-type MOSFET gate electrode with respect to the Si substrate, and is capable of patterning both the materials at the same time.

If a gate electrode made of a high-melting-point metal silicide and having a Si content higher than the stoichiometric content thereof, such as disclosed in the second literature and JP-1996-130216A, is used, there may occur diffusion of impurities doped in the gate electrodes toward the outside thereof, or may occur a significant range of variation in the effective work function due to phase separation of the silicide during a high-temperature anneal process for activating the source/drain regions, thereby causing degradation in the reproducibility or uniformity of the devices.

In the technique for modulating the effective work function by using the full silicidation of the polysilicon doped with impurities, such as described in the third and fourth literatures, if the gate insulation film is configured by a high-permittivity film (HfSiON), there is a problem in that a pinning phenomenon of the Fermi level occurring on the poly-Si/HfSiON interface before the full silicidation is not avoided, whereby the effect of modulation of the effective work function by using the impurities cannot be obtained. Thus, there occurs a problem in that the threshold voltage of the MOSFET cannot be set at a suitable value.

In the phase-controlled Ni-full-silicidation technique described in the fifth literature and WO 2006/001271, if the MOSFET gate electrode materials directly contact each other, one of the gate electrode materials diffuses toward the other of the gate electrode materials during the full silicidation (during the anneal), as shown by an arrow in FIG. 6, whereby there may occur a case wherein the composition of the gate electrodes becomes uneven and it is impossible to control the Vth at a desired value.

FIGS. 4A to 4D show an ideal structure in the case where the MOSFET gate electrode materials contact each other and where these gate electrodes are formed by the phase-controlled full-silicidation technique. FIG. 4A shows a top plan view of the semiconductor device. FIGS. 4B, 4C and 4D are B-B' sectional view, C-C' sectional view and D-D' sectional view, respectively, taken in FIG. 4A. If Ni silicides having different crystal phases are formed for the N-type MOSFET and P-type MOSFET gate electrodes by using the phase-controlled Ni-full-silicidation technique, the different crystal phases contact each other on the device isolation area, as shown in FIGS. 4A and 4B, and it is thus necessary to maintain both the crystal phases in a stable state.

However, since the N-type MOSFET and P-type MOSFET gate electrode materials are coupled with each other on the device isolation area, the gate electrode materials diffuse from one of the gate electrodes to the other during forming the MOSFET gate electrodes or the anneal processing performed thereafter, and the composition of the gate electrodes may be deviated from a desired composition.

For example, in the semiconductor device of WO 2006/001271, as shown in FIG. 7, excessive Ni deposited on the P-type MOSFET area diffuses in a lateral direction (direction from the P-type MOSFET gate electrode toward the N-type MOSFET gate electrode: direction of the arrow shown in FIG. 7). Therefore, there occurs a case where the excessive Ni diffuses into a portion of the gate pattern, to be formed as the N-type MOSFET gate electrode, across the device isolation area to thereby silicidate the gate pattern. As a result, a crystal phase same as the crystal phase of the P-type MOSFET gate electrode may be formed in a part of the N-type MOSFET gate electrode, to cause a range of variation in the Vth.

In addition, in those semiconductor devices, there is a case where the gate electrode materials diffuse between the MOSFET gate electrodes due to a post-process heat treatment conducted after forming the gate electrodes, in addition to the above silicidation process. As a result, as shown in FIG. 7, MOSFET gate electrodes have therein an intermediate phase or mixed phases including different phases, thereby causing a range of variation of the Vth.

SUMMARY OF THE INVENTION

In view of the above, it is an exemplary object of the present invention to provide a semiconductor device having a uniform composition of the gate insulation film and gate electrode, capable of controlling the Vth in a wide range without degrading the reliability, and including N-type MOSFET gate electrode and P-type MOSFET gate electrode having different silicides, and a method for manufacturing the same.

The present invention provides, in an example, a semiconductor device including: a semiconductor substrate; a device isolation area that isolates a surface portion of the semiconductor substrate into a P-type area and an N-type area; a gate electrode line that extends on the device isolation area, P-type area and N-type area, and is insulated from the P-type area and N-type area by a gate insulation film; source/drain diffused regions formed in each of the P-type area and N-type area to sandwich therebetween the gate electrode line, wherein: the gate electrode line includes a first silicide region formed on the N-type area and including a silicide of metal M1, a second silicide region formed on the P-type area and including a silicide of metal M2, and an to impurity-doped silicon region formed on the device isolation area to separate the first silicide region 8 and the second silicide region from each other.

The present invention provides, in another example, a method for manufacturing a semiconductor device including the steps of: forming a gate insulation film on a semiconductor substrate, a surface portion of which is isolated by a device isolation area into an N-type area and a P-type area; forming a gate electrode pattern including therein silicon on the device isolation area and the gate insulation film; forming source/drain regions on both sides of the gate electrode pattern in the N-type area and P-type area; forming an interlayer dielectric film that exposes therethrough the gate electrode pattern and covers the source/drain regions; selectively implanting impurities into a portion of the gate electrode pattern on the device isolation area, to form an impurity-doped silicon section; reacting silicon of a portion of the gate electrode pattern on the N-type area with the metal M1, to form a first silicide region; and reacting silicon of a portion of the gate electrode pattern on the P-type area with the metal M2, to form a second silicide region.

In this text, "higher-permittivity film (high-k film)" is used to differentiate the same from a silicon dioxide ($SiO_2$) insulation film which has been generally used heretofore as the gate insulation film, no and means an insulation film having a dielectric constant higher than that of the silicon dioxide. The concrete value itself is not limited.

In this text, "first gate electrode" and "second gate electrode" mean a portion of a gate electrode line on a P-type area and a portion thereof on an N-type area, respectively, and a gate electrode does not include the other portion of the gate electrode line.

In this text, "effective work function" or "apparent work function" of the gate electrode means a work function that is obtained from the flat band voltage by a CV measurement, and includes, in addition to the original work function of the gate electrode, effect of the fixed charge within the insulation film, dipoles formed on the interface, and pinning of the Fermi level. Thus, it is differentiated from the original "work function" of the material configuring the gate electrode.

In this text, "MOS" (metal oxide semiconductor) means a three-layer structure including a conductor, an insulator and a semiconductor, wherein the conductor is not limited to a single metal element and the insulator is not limited to silicon dioxide.

The above and other objects, features and advantages of the present invention will be more apparent from the following icy description referring to the accompanying drawings.

BEST MODES OF CARRYING OUT THE INVENTION

Figure 1A:
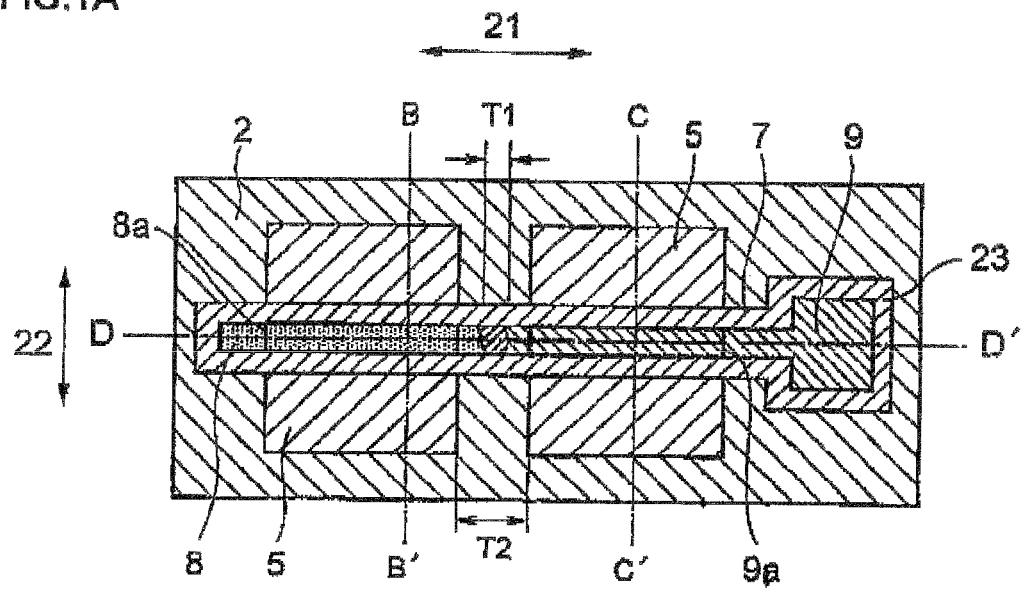
FIG. 1A is a top plan view of a semiconductor device according to an example of the present invention

Hereinafter, examples of the present invention will be described with reference to the accompanying drawings. For a better understanding, similar constituent elements are shown as designated by similar reference numerals throughout the drawings.

Figure 1B:
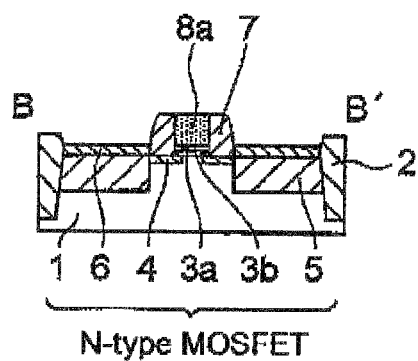
FIG. 1B is a B-B' sectional view of the semiconductor device of FIG. 1A.
Figure 1C:
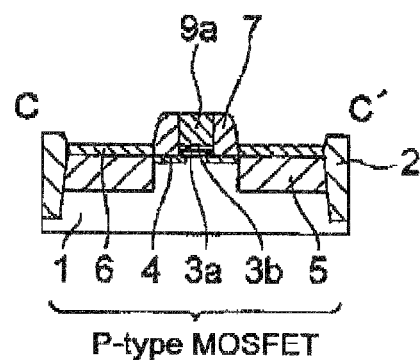
FIG. 1C is a C-C' sectional view of the semiconductor device of FIG. 1A.
Figure 1D:
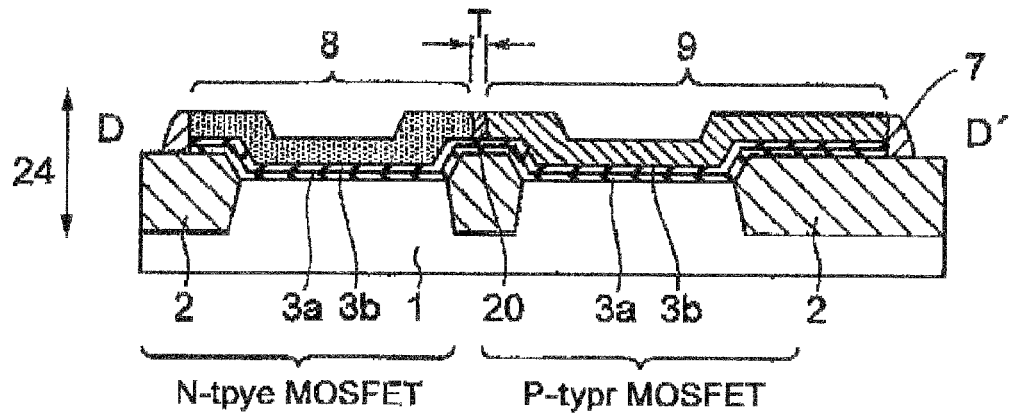
FIG. 1D is a D-D' sectional view of the semiconductor device of FIG. 1A.
Figure 2:
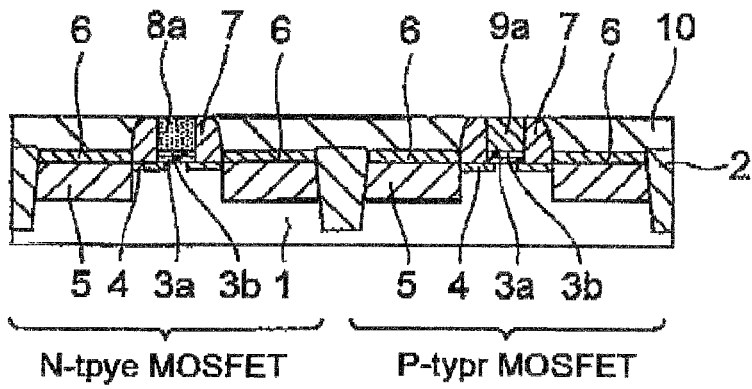
FIG. 2 is a sectional view of a semiconductor device according to another example of the present invention.

FIGS. 1A-1D illustrate an example of a semiconductor device including an N-type MOSFET and a P-type MOSFET according to the present invention. FIG. 1A shows a top plan view of this semiconductor device, and FIGS. 1B, 1C and 1D show B-B' sectional view, C-C' sectional view and D-D' sectional view, respectively, of the semiconductor device of FIG. 1A.

In a silicon substrate 1 shown in FIGS. 1A-1D, a P-type area (P-type well; P-type active area) and an N-type area (N-type well; N-type active area) are provided. A device isolation area 2 is provided between the P-type area and the N-type area, insulating these areas (for device isolation) from one another.

As illustrated in FIGS. 1A and 1B, on the P-type area, there are provided gate insulation films 3a, 3b and a second gate electrode 8a, wherein a gate sidewall 7 is provided one the side surface of the second gate electrode 8a. The gate insulation film has a two-layer structure, and a SiO$_2$ film 3a and a higher-permittivity insulation film (HfSiON film) 3b are provided on the P-type area. An extension area 5, and N-type source/drain regions 4 are provided on both sides of the second gate electrode 8a in the P-type area. These P-type area, gate insulation films 3a and 3b, second gate electrode 8a, extension area 5, and source/drain regions 4 configure an N-type MOS transistor.

Similarly, as illustrated in FIGS. 1A and 1C, on the N-type area, there are provided a gate insulation film and a first gate electrode 9a, wherein a gate sidewall 7 is formed on the side surface of the first gate electrode 9a. The gate insulation film has a two-layer structure including a SiO$_2$ film 3a and a higher-permittivity insulation film (HfSiON film) 3b. An extension area 5 and P-type source/drain regions 4 are provided on both sides of the first gate electrode 9a in the N-type area. These N-type area, gate insulation films 3a and 3b, first gate electrode 9a, extension area 5 and source/drain regions 4 configure a P-type MOS transistor.

Those first gate electrode 9a and second gate electrode 8a configure part of the gate electrode line. More specifically, in the semiconductor device of the present invention, a single gate electrode line 23 is formed to extend in the direction 21 which is perpendicular to the gate-length direction 22 (channel-length direction, or source/drain regions direction) of the N-type MOSFET and P-type MOSFET and parallel to the semiconductor substrate. A portion of the gate electrode line 23 overlying the P-type area configures the second gate electrode 8a (illustrated by thick line) for the N-type MOSFET. A portion of the gate electrode lines 23 overlying the N-type area configures the first gate electrode 9a (illustrated by thick line) for the P-type MOSFET.

The first gate electrode is configured by a first silicide region including therein silicide of a metal M1, and the second gate electrode is configured by a second silicide region including therein silicide of a metal M2. The first and second silicide regions may configure a part of the first and second gate electrodes, respectively, or may configure all of them. If the first and second silicide regions configure a part of the first and second gate electrodes, respectively, the first and second gate electrodes may have a low-resistance layer, as will be described later.

The first and second silicide regions include therein silicide of metal M1 and silicide of metal M2, respectively, and may have another component in addition thereto. The silicide of metal M1 and silicide of metal M2 may be of a single silicide component, or may be of a plurality of silicide components.

Although metals M1 and M2 may be of different metallic is elements or of the same metallic element, the silicide of metal M1 and silicide of metal M2 are not the same material. Thus, if metals M1 and M2 are of the same metallic elements, the silicide of metal M1 and silicide of metal M2 are silicides having different compositions therebetween (silicides having different metal contents or silicides having different silicon contents).

The gate electrode line 23 includes an electrode portion 8 including the second gate electrode 8a, an electrode portion 9 including the first gate electrode 9a, and an impurity-diffused silicon region (impurity-doped region) 20 provided on the device isolation area so that these electrode potions 8 and 9 do not directly contact each other. More specifically, the impurity-doped region 20 is provided in the gate electrode line 23 along the entire thickness direction 24 and entire widthwise direction thereof, whereby the impurity-doped region 20 is provided between both the electrode portions 8 and 9 to prevent the electrode portion 8 and electrode portion 9 from, directly contacting each other.

The impurity-doped region 20 may be formed on a portion of to the device isolation area or entire device isolation area. However, in the semiconductor device of the present invention, the impurity-doped region 20 is formed only on the device isolation area, and is not provided within the first and second gate electrodes. Similarly, although the electrode portions 8 and 9 may coincide with the first and second gate electrodes, respectively, these portions may extend on a position of the device isolation area. The impurity-doped region includes therein impurities at a concentration higher than that in the first and second gate electrodes, and may additionally include polysilicon or another component therein.

Since the impurity-doped region includes therein impurities at a concentration higher than that in the first and second gate electrodes, the impurity element in the impurity-doped region prevents the gate electrode materials from diffusing in a lateral direction, whereby the first and second gate electrodes have a uniform composition.

The configuration wherein the silicide of metal M1 and silicide of metal M2 are different silicides having different compositions therebetween, as described above, controls the effective work function of the first and second electrode materials to a desired value, whereby the Vth of the N-type MOSFET and P-type MOSFET can be controlled at a desired value.

Figure 8:
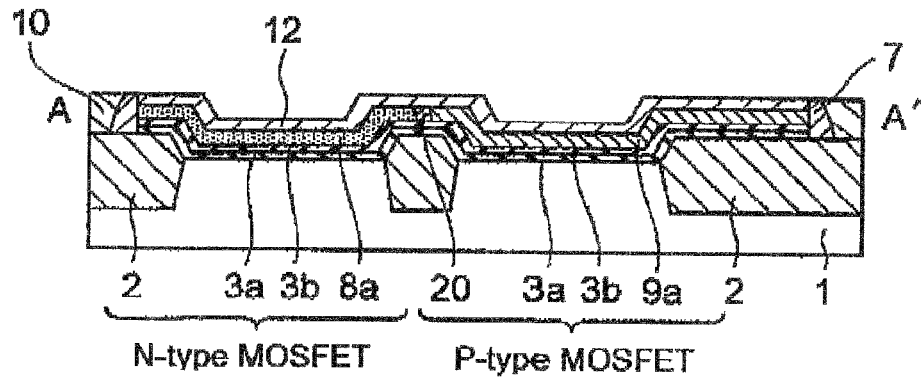
FIG. 8 is a sectional view of an example of the semiconductor device of the present invention.

FIG. 8 shows another example of the semiconductor device of the present invention. The semiconductor device of FIG. 8 is different from the semiconductor device shown in FIGS. 1A-1D in that the first and second gate electrodes 9a and 8a have a two-layer structure, and each gate electrode includes a low-resistance layer in the top portion thereof. The configuration wherein the gate electrodes 8a and 9a have a two-layer structure, and include a low-resistance layer as the topmost layer reduces the line resistance of the gate electrodes.

The "low-resistance layer" specifies a topmost layer, if the first and second gate electrodes includes a plurality of layers and the topmost layer thereof has a lowest resistance among the plurality of layers. Examples of the first and second gate electrodes including the low-resistance layer include one having a configuration such as described hereinafter.

The first gate electrode includes a first silicide region including a $Ni_2Si$ crystal phase or $Ni_3Si$ crystal phase as the silicide of metal M1, and a low-resistance layer including a NiSi crystal phase. The second gate electrode includes a second silicide region including a $NiSi_2$ crystal phase as the silicide of metal M2, and a low-resistance layer including a NiSi crystal phase. In this text, even if the low-resistance layer includes a silicide, this low-resistance layer is not included in the term of first and second silicide regions. Thus, in this text, the region of the gate electrode other than the low-resistance layer and including therein silicide is referred to as the first silicide region or second silicide region.

Provision of the low-resistance layer as described above effectively reduces the contact resistance with an interconnection. The configuration wherein the bottom portion and the low-resistance top portion of the gate electrode include different silicides having different compositions and including the same metal simplifies the fabrication process. Further, those layers may be configured by crystal phases of the same metal, to thereby improve the stability of the whole gate electrode line.

The first gate electrode 9a and second gate electrode 8a may be electrically connected together or not. If the first gate electrode 9a and second gate electrode 8a are electrically connected, this semiconductor device configures a CMOS-FET, for example.

The impurity-doped region is a region that may configure a part or all of the gate electrode line provided on the device isolation area, and has an impurity concentration higher than that in the first and second gate electrodes. More specifically, the impurity-doped region has an impurity concentration higher than the value of the highest impurity concentration in the first and second gate electrodes. This impurity-doped region may be assured by measuring the species of the impurity element and impurity concentration profile in the thickness direction by using an EDX (fluorescent X-ray) analysis.

The term impurity concentration as used above means the overall concentration of a plurality of species of impurities, if the plurality of species of impurities are included in the first and second gate electrodes and the impurity-doped region, and thus does not mean the impurity concentration of a single species of the impurities. Thus, in this case, the overall impurity concentration of all the impurities in the impurity-doped region is higher than the maximum impurity concentration among the impurity concentrations expressed by the sum of impurity concentrations of all the species of impurities in the first and second gate electrodes.

There may be a case, depending on a fabrication process, where a thin region including impurities at a higher concentration exists in the first and second gate electrodes in the vicinity of the gate insulation film. In such a case, the impurity concentration of this region is not taken into consideration. This higher-concentration impurity-doped region existing in the first and second gate electrodes in the vicinity of the gate insulation film can be clearly distinguished from other areas by SIMS analysis etc., as will be described later.

Figure 13:
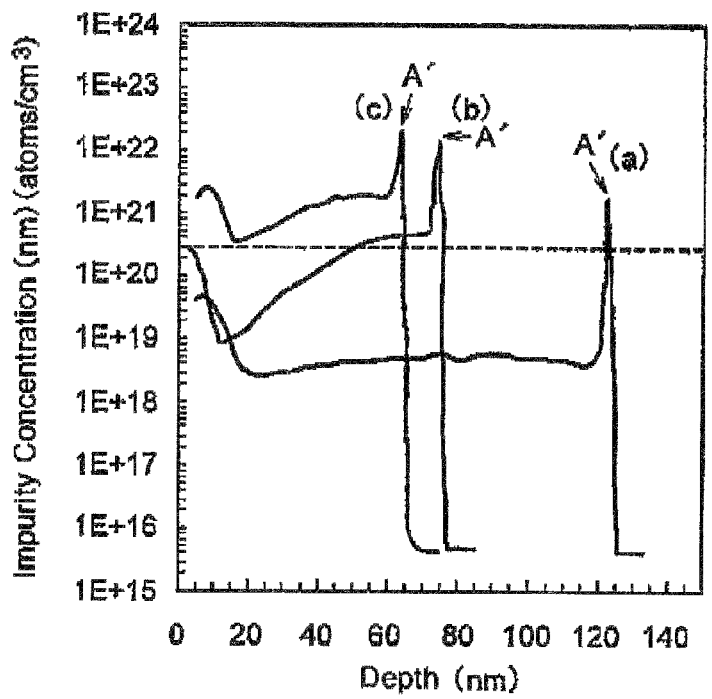
FIG. 13 is a graph showing an example of the concentration profile of the impurity concentration in the gate electrode of a conventional semiconductor device.

Hereinafter, the impurity concentration profile in the gate electrodes will be described. FIG. 13 shows an example of the impurity concentration profile in a conventional semiconductor device along the thickness direction of the gate electrode (direction perpendicular to the semiconductor substrate; direction of arrow 24 in FIG. 1D, for example) after the silicidation. The impurity concentration profile was obtained by measuring the N-type MOSFET gate electrode doped with As as impurities, by using an SIMS (secondary ion mass spectrometry) analysis technique. The measurement is such that the primary ions are implanted into the sample during the sample etching from the semiconductor substrate side, and Cs was used as the primary ions. The depth at 0 nm on the abscissa in FIG. 13 corresponds to the top surface of the gate electrode (the surface opposing the surface in contact with the gate insulation film), whereas the deepest position in FIG. 13 corresponds to the portion of the gate electrode in contact with the gate insulation film.

In any of the graphs (a)-(c) shown in FIG. 13, a peak A' showing a high impurity concentration appeared on the right end of the graph, whereby it is understood that the gate electrode has a thickness corresponding to the rightmost thickness at the peak A' in the semiconductor device shown by graphs (a)-(c). Here, the rightmost end shows a portion of the gate electrode in contact with the gate insulation film. The peak A' of graphs (a)-(e) means that the gate electrode material (gate pattern) is subjected to silicidation from the top toward the bottom during formation (silicidation) of the gate electrode, and the impurities within the gate electrode are expelled toward the interface with the gate insulation film along with the silicidation.

In this way, the region including impurities at a higher concentration is formed at the interface with the gate insulation film depending on the fabrication process; however, this area is clearly discriminated by using the SIMS. Thus, in the present invention, the impurity-doped region has an impurity concentration higher than the highest impurity concentration in the first and second gate electrodes except for this area including the impurities at a higher concentration.

Figure 3:
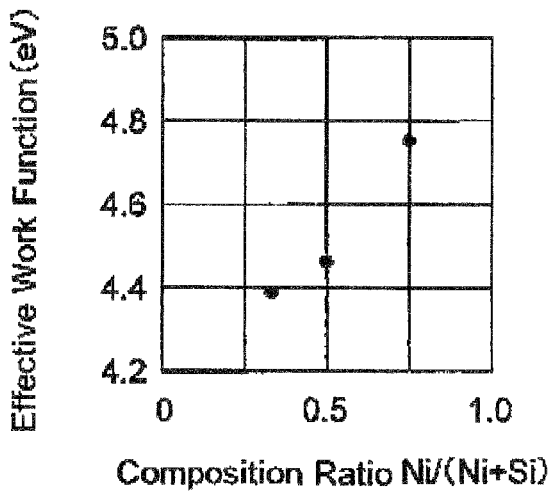
FIG. 3 is a graph showing the relationship between the composition of Ni-silicide and the effective work function caused by a pinning of the Fermi level.
Figure 4A:
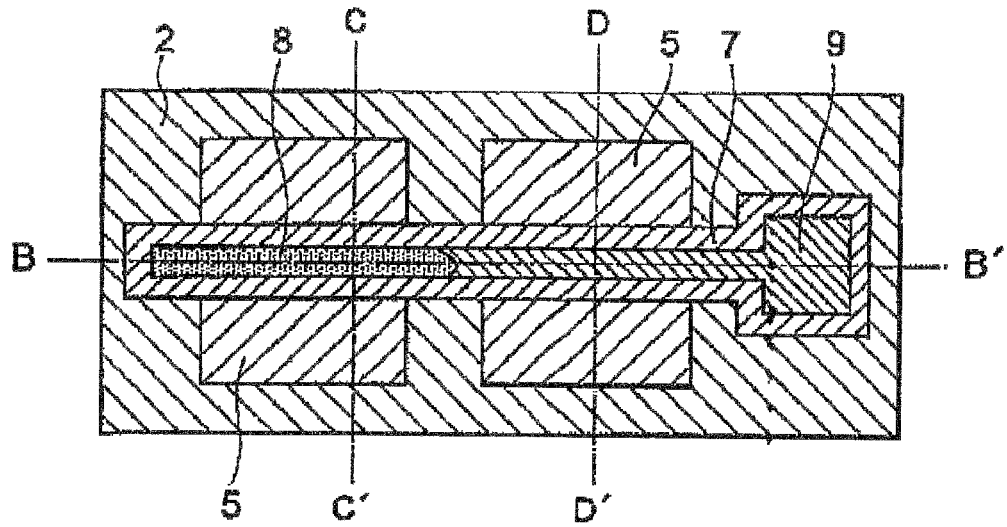
FIG. 4A is a top plan view of the conventional semiconductor device.
Figure 4B:
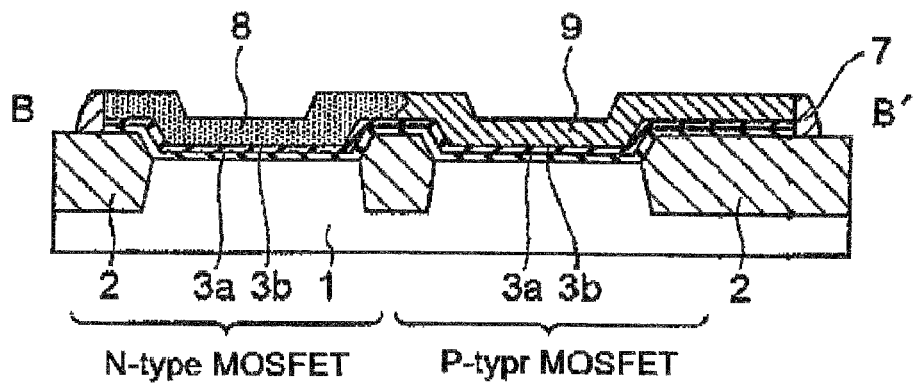
FIG. 4B is a B-B' sectional view of the semiconductor device of FIG. 4A.
Figure 4C:
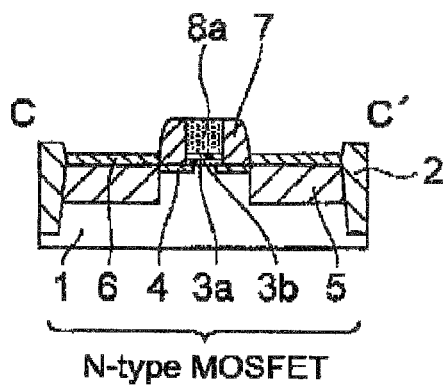
FIG. 4C is a C-C' sectional view of the semiconductor device of FIG. 4A.
Figure 4D:
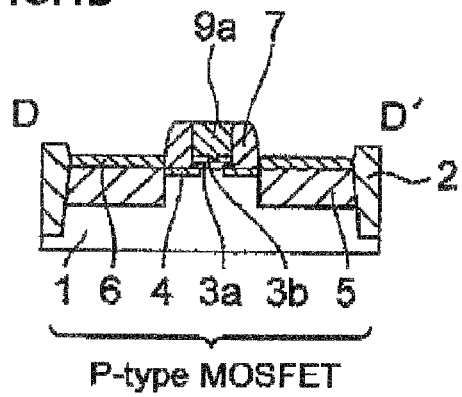
FIG. 4D is a D-D' sectional view of the semiconductor device of FIG. 4A.
Figure 5A:
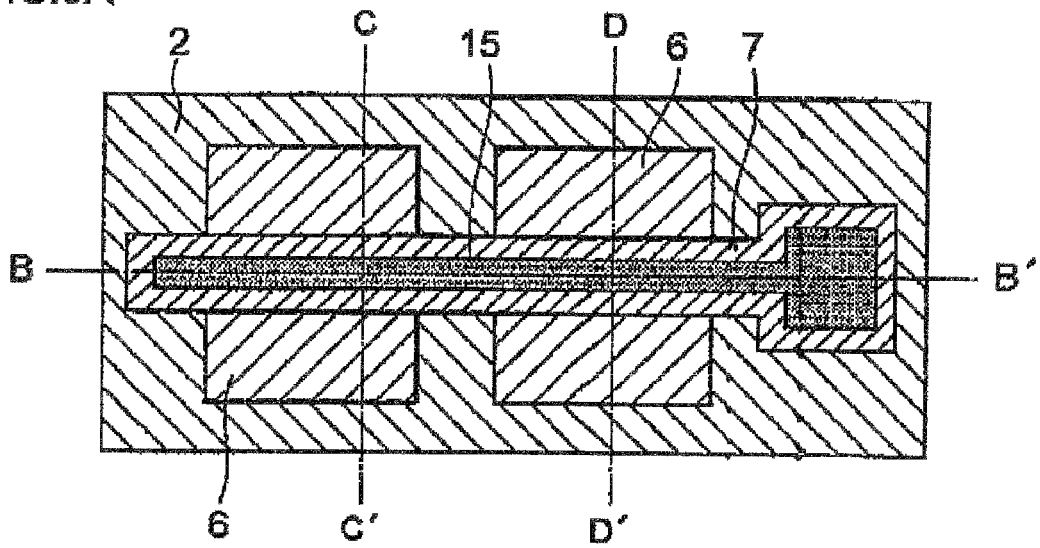
FIG. 5A is a top plan view of the conventional semiconductor device in a process step of fabrication process thereof.
Figure 5B:
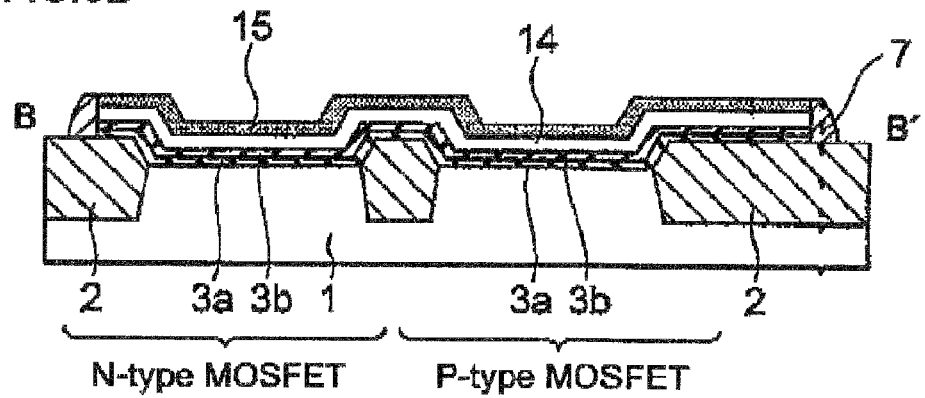
FIG. 5B is a B-B' sectional view in the process step of FIG. 5A.
Figure 5C:
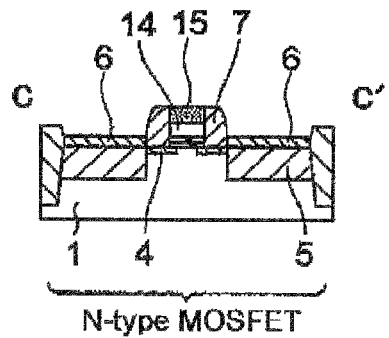
FIG. 5C is C-C' sectional view in the process step of FIG. 5A.
Figure 5D:
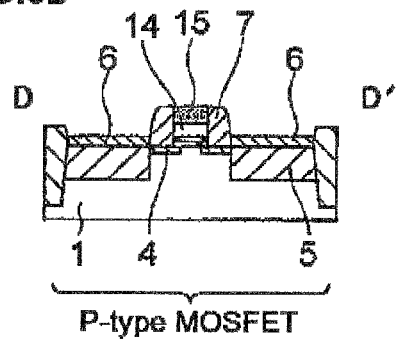
FIG. 5D is a D-D' sectional view in the process step of FIG. 5A.
Figure 5E:
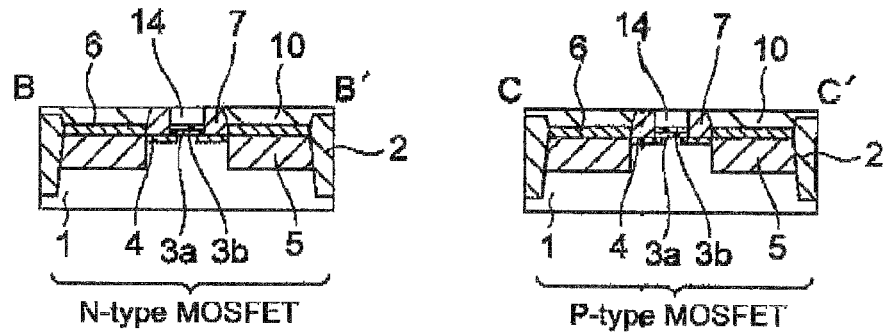
FIG. 5E is a sectional view corresponding to FIGS. 5C and 5D in a process step subsequent to FIG. 5A.
Figure 5F:
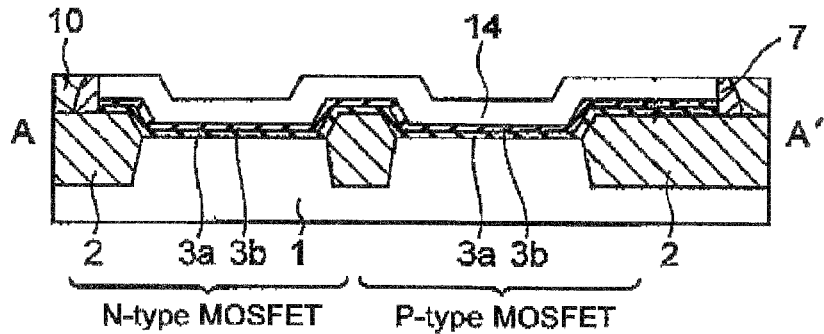
FIG. 5F is a sectional view corresponding to FIG. 5B in the process step of FIG. 5E.
Figure 5G:
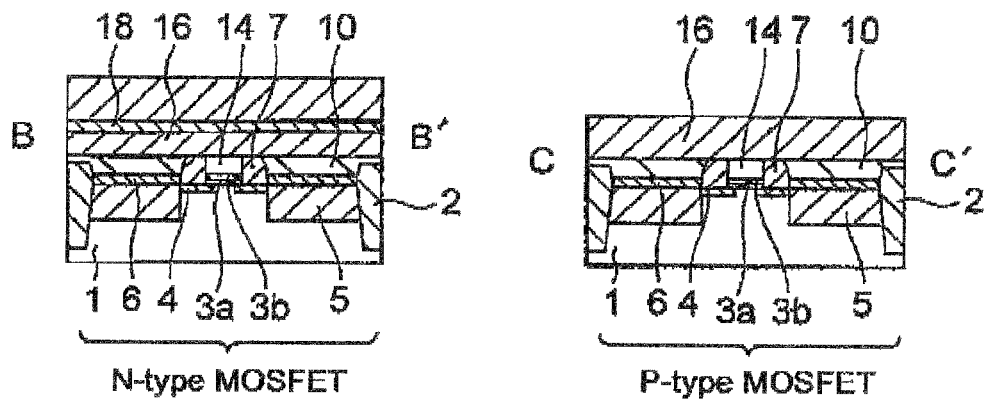
FIG. 5G is a sectional view corresponding to FIGS. 5C and 5D in the process step subsequent to FIG. 5E.
Figure 5H:
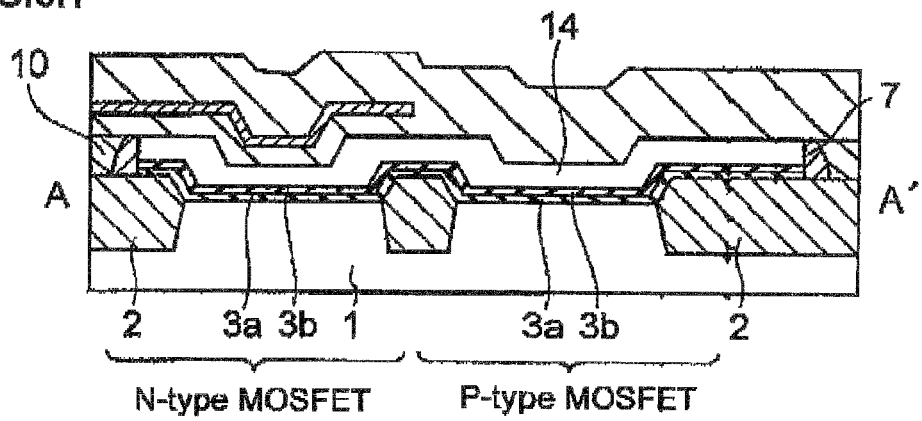
FIG. 5H is a sectional view corresponding to FIG. 5B in the process step of FIG. 5G.
Figure 5I:
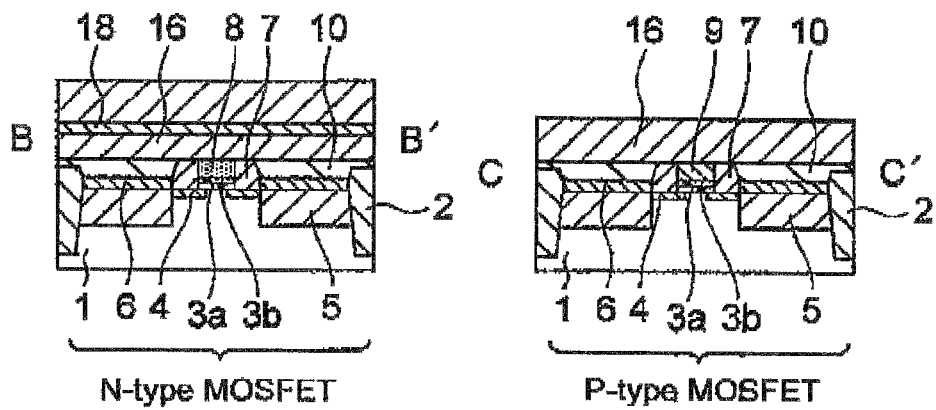
FIG. 5I is a sectional view corresponding to FIGS. 5C and 5D in the process step subsequent to FIG. 5G.
Figure 5J:
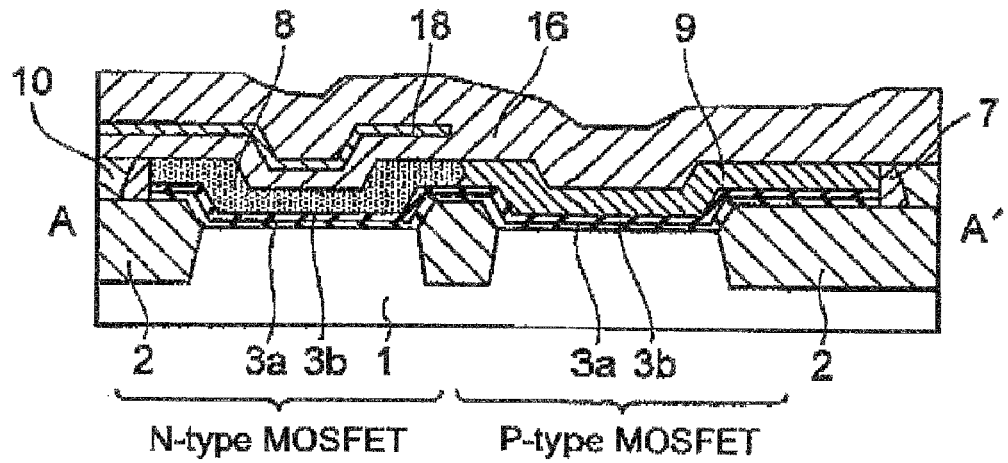
FIG. 5J is a sectional view corresponding to FIG. 5B in the process step of FIG. 5I.
Figure 6:
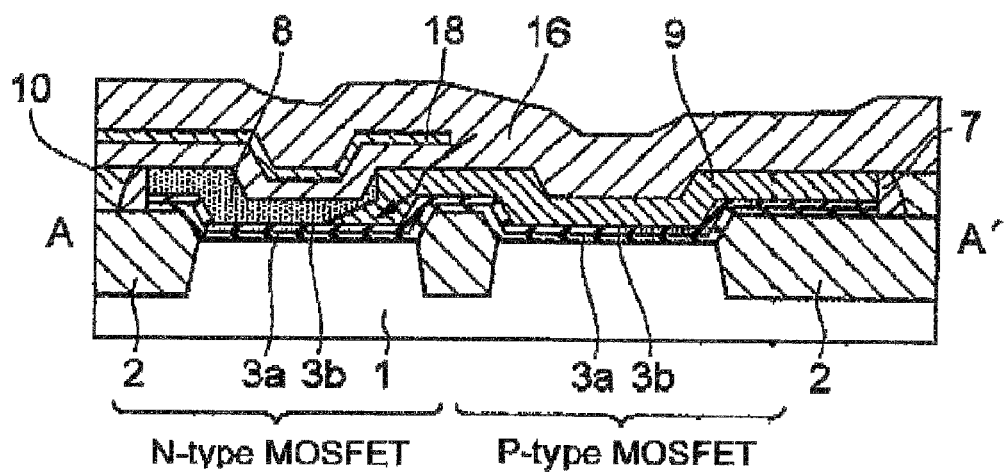
FIG. 6 is a sectional view showing a conventional semiconductor device.
Figure 7:
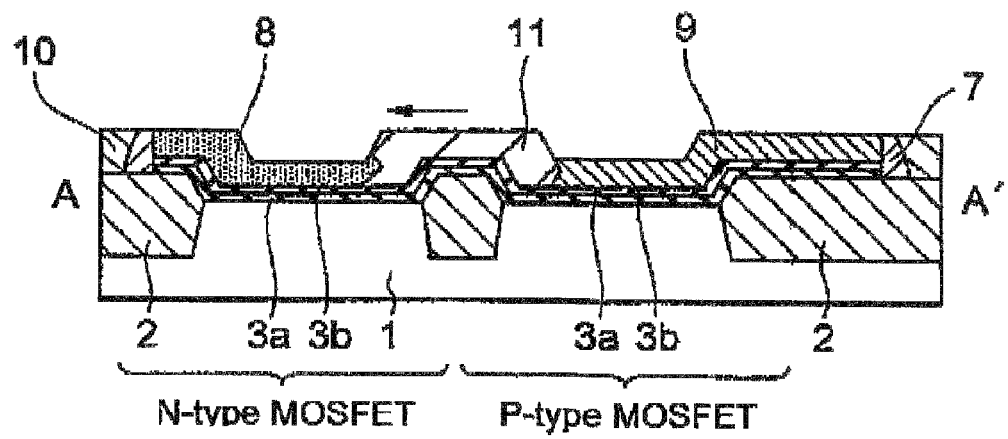
FIG. 7 is a sectional view showing a conventional semiconductor device.

The reason for the gate electrode having different thicknesses for the eases of graphs (a)-(c) in FIG. 3 will be described hereinafter. The graphs (a)-(c) in FIG. 13 consecutively correspond to a smaller amount to a larger amount of implanted impurities. A higher impurity concentration in the gate electrode material causes the silicidation to occur less likely, as described before, whereby the gate electrode is likely to be configured by a silicide having a lower metal-element content. As a result, the degree of expansion of the gate electrode material upon the silicidation becomes small, whereby the gate electrode has a smaller thickness. On the other hand, if the impurity concentration in the gate electrode material is lower, the silicidation is more likely to occur, whereby the gate electrode is likely to be configured by a silicide having a higher metal content. As a result, the degree of expansion of the gate electrode material upon the silicidation becomes larger, whereby the gate electrode has a larger thickness. The reason for the gate electrode having different thicknesses after the formation thereof depending on the impurity concentrations in the gate electrode material is that the impurity concentration affects the rate of silicidation and the composition of the silicide of metal M.

Although the impurity-doped region in the present invention includes an impurity element at a higher concentration, the impurity-doped region may include polysilicon or some other component(s) in addition thereto. The provision of the impurity-doped region in this way prevents the first gate electrode and the second gate electrode from directly contacting each other. In addition, the impurity-doped region has an effect of preventing the gate electrode materials from diffusing, whereby each of the gate electrode materials is not diffused toward the other of the gate electrode materials through the impurity-doped region. The reason therefor will be described hereinafter.

In a conventional semiconductor device including an N-type MOSFET and a P-type MOSFET, the constituent materials of both the gate electrodes directly contact each other, and gate electrode materials of the respective MOSFETs are formed separately or concurrently. For this reason, the gate electrode materials diffuse to each other via the interface between both the gate electrode materials, whereby it is difficult to form a gate electrode material having a uniform composition.

More specifically, this unevenness of the gate electrode materials is caused mainly by diffusion of the metallic element in the silicide configuring one of the gate electrode materials and having a higher metal content into and through the silicide configuring the other of the gate electrode materials and having a lower metal content via the interface between the one and the other of the gate electrode materials. In this case, if the silicide configuring the one of the gate electrode materials has a plurality of possible crystal phases and yet the selected crystal phase is not one having a highest metallic content, the metallic element is further diffused into the silicide configuring the gate electrode and finally into the one of the gate electrodes to cause degradation in the uniformity of the composition.

On the other hand, in the semiconductor device of the present invention, prevention of diffusion of the gate electrode materials is achieved, the considered reason of which will be described hereinafter. The semiconductor device of the present invention includes an impurity element at a higher concentration in the polysilicon on the device isolation area. Thus, during manufacture of this semiconductor device, the polysilicon configuring one of the gate electrode materials is silicidated, which causes a tendency that the metallic element is diffused into the region including impurities at a higher concentration and formed on the device isolation area to expel the impurities in the polysilicon, to thereby form a silicide having a lower impurity concentration. However, in the case where the polysilicon includes impurities at a higher concentration, a larger amount of impurities that are bonded to the silicon atoms in the polysilicon must be expelled, which costs a larger amount of energy as compared to the case where the polysilicon include no impurities or includes impurities at a smaller concentration. Thus, it is supposed that the diffusion rate of the metallic element is reduced to cause less silicidation.

On the other hand, if one of the first and second gate electrodes is already formed and the other of the gate electrodes is to be formed, or if both the first and second gate electrodes are already formed, when the metallic element configuring the one of the gate electrode materials is diffused into the region formed on the device isolation area and including impurities at a higher concentration and thus silicidates the same, a tendency occurs wherein the metallic element is likely to expel the impurities toward the other of the gate electrode materials. However, the metallic silicide is already formed in the other of the gate electrode materials to which the impurities are to be expelled, expulsion of the impurities to the metallic silicide is extremely difficult. Thus, expulsion of the impurities by the metallic element does not occur, as a result of which it is difficult for the metallic element to diffuse into this area including impurities at a higher concentration. It is probable that the impurity-doped region renders occurring of the silicidation more difficult in this way.

The conventional full-silicidated electrode is formed by depositing a metallic film on the polysilicon gate pattern, and performing an anneal process (heat treatment) to silicidate the gate pattern consecutively from the top portion to the bottom portion (toward the gate insulation film). Thus, if the polysilicon gate pattern includes an impurity element, the impurity ions are expelled from the top portion toward the bottom portion during this silicidation. Accordingly, the full silicidation, if performed, causes the impurity element to be segregated in an extremely thin area in the vicinity of the gate insulation film, whereby the impurity element in the region other than this area becomes lower than the original concentration of the impurity element in the polysilicon gate pattern.

Such an impurity concentration profile is similar to that in the vicinity of the interface between the MOSFET gate electrode materials on the device isolation area in the conventional device (i.e., only the portion in the vicinity of the gate insulation film assumes a higher impurity concentration). Thus, this interface cannot prevent diffusion of each gate electrode material along the entire thickness direction of the gate electrode line (direction perpendicular to the semiconductor substrate), to cause the composition of the respective gate electrodes nonuniform, whereby it is difficult to control the Vth of the respective MOSFETs at a desired value.

On the other hand, in the semiconductor device of the present invention, the impurities are distributed along the entire thickness direction of the gate electrode line (direction perpendicular to the semiconductor substrate). The impurity-doped region is such that the impurities implanted into the polysilicon gate pattern beforehand are segregated along with the silicidation, and a high-impurity concentration is obtained due to the segregation of the impurities implanted in the original polysilicon pattern. Accordingly, bidirectional diffusion of the gate electrode materials can be effectively prevented by the impurity-doped region.

A higher impurity concentration in the impurity-doped region more suppresses diffusion of the metal configuring the silicide, thereby suppressing the bidirectional diffusion between the silicides having different compositions and configuring the gate electrodes, as well as the phase change accompanying the bidirectional diffusion. It is to be noted that the impurity concentration in a usual polysilicon configuring the gate electrode is less than $1 \times 10^{20}$ cm$^{-3}$. Thus, the impurity concentration of a portion of the gate electrode other than the vicinity of the gate insulation film becomes lower than this value due to segregation of the impurities after performing the silicidation, as described above. Therefore, the impurity concentration in the impurity-doped region which is equal to or more than $1\times10^{20}$ cm$^{-3}$ effectively suppresses the impurity diffusion.

If the main component of the impurity-doped region is silicon, the concentration of $1\times10^{21}$ cm$^{-3}$ or above is close to the solid solubility limit concentration of the impurities in silicon (maximum soluble concentration in silicon). Thus, a preferable impurity concentration in this impurity-doped region is practically $1\times10^{21}$ cm$^{-3}$ or above, at which the metal configuring the silicide is scarcely diffused into the impurity-doped region. More preferably, the impurity concentration is $1\times10^{22}$ or above. In this case, diffusion of the metal of the silicides into the impurity-doped region scarcely arises. As a result, a stable interface between the silicides having different compositions and configuring the gate electrodes can be formed on the device isolation area, whereby the composition of respective gate electrodes can be made uniform and stable. The impurity-doped region may include therein a plurality of impurity elements or a single impurity element. If the impurity-doped region includes therein a plurality of impurity elements, it is preferred that the overall concentration of the impurity elements be in the above range.

As the species of the impurity element included in the impurity-doped region, boron, arsenic, phosphor, antimony, nitrogen, carbon, and fluorine may be preferably used. These impurity elements may be used as a single species or a combination of a plurality of species. Among those, antimony, arsenic, phosphor and boron may be quoted as more preferable elements in the order of preference. Antimony, arsenic, phosphor and boron do not cause a higher resistance and are not aggregated, even when implanted at a higher concentration in the polysilicon. Among these impurity elements, an impurity element having a larger atomic radius achieves a higher effect on the prevention of diffusion of the metal during the silicidation, The impurity-doped region configures a part or all of the portion of the gate electrode line provided on the device isolation area. Thus, it is preferable that the length T1 of the portion of the impurity-doped region on the device isolation area in the horizontal direction (direction as viewed from the N-type MOSFET gate electrode toward the P-type MOSFET gate electrode; perpendicular to the gate-length direction and parallel to the semiconductor substrate) be equal to or smaller the length T2 of the device isolation area (T1≦T2). This is because if T1>T2, a part of the MOSFET gate electrodes includes impurities at a higher concentration, to cause a non-uniform composition of the gate electrodes and increase a range of variation in the Vth.

It is preferable that the horizontal thickness T1 of the impurity-doped region be small as much as possible so long as it does not impair the effect of the present invention. More concretely, T1 is preferably 1 nm or above when the roughness is taken into consideration, and more preferably 3 nm or above when the intensity of exposure light during the ion implantation for forming the impurity-doped region is taken into consideration. It is preferable that T1 be 10 nm or smaller since it increases the ratio of the silicide region to the entire gate electrode line, to thereby suppress the electric resistance of the gate electrode line to a lower value.

The gate insulation film included in the respective MOSFETs in the present invention may be configured by a single or a plurality of layers without being limited to a particular number. A higher-permittivity material is preferably used as the gate insulation film. The higher-permittivity material in combination with the phase-controlled full-silicidation technique, as described hereinafter, can obtain a highest effect. This is because the phase-controlled full-silicidation technique, if combined with the higher-permittivity material for the gate insulation film, as described hereinafter, achieves a wider control range of the effective work function.

Examples of the gate insulation film using a higher-permittivity material include a gate insulation film including a higher-permittivity insulation film, and a gate insulation film including a higher-permittivity insulation film layered on a silicon oxide film or silicon nitride film. Here, "higher-permittivity insulation film" means a material having a dielectric constant higher than the dielectric constant of a silicon dioxide ($SiO_2$). Examples of this material include metal oxide, metal silicate, metal oxide doped with nitrogen, metal silicate doped with nitrogen etc.

Among the other higher-permittivity insulation films, a higher-permittivity insulation film doped with nitrogen is preferably used in the view point of suppression of crystallization and improvement of the reliability. Examples of the metallic element included in the higher-permittivity material include hafnium (Hf) or zirconium (Zr) in the view point of heat resistance of the film and suppression of the fixed electric charge in the film. Examples of such a higher-permittivity material include: a metal oxide including Hf or Zr, and Si; and a metal oxynitride including this metal oxide and additionally nitrogen, wherein HfSiO is more preferred, and HfSiON is further more preferred.

As the higher-permittivity material, one having an atomic composition ratio deviated from that of HfSiON may be used. More concretely, if it is expressed by $Hf_aSi_bON$, the average concentration ratio (ratio of number of atoms) for Hf and Si, $a/(a+b)$, is preferably not less than 0.3 and not larger than 0.7. The ratio which is equal to or larger than 0.3 effectively suppresses the leakage current flowing across the gate insulation film, during operation of the device, to thereby reduce the power dissipation remarkably. On the other hand, the ratio which is equal to or less than 0.7 assures a higher heat resistance of the HfSiON film, prevents crystallization and occurring of defects during a manufacturing process of the device, and suppresses degradation of the reliability and degradation of the performance.

If the gate insulation film includes a plurality of layers, a part of which is configured by a higher-permittivity insulation film, then the higher-permittivity insulation film is preferably disposed in contact with the gate electrode. A combination of the gate electrode and the higher-permittivity insulation film in contact therewith controls the Vth (threshold voltage) of a transistor in a wider range. In this case, a silicon oxide film or a silicon oxynitride film may be provided on the interface between the higher-permittivity insulation film and the silicon substrate, in order for reducing the interface state on the interface between the silicon substrate and the gate insulation film and reducing the influence by the fixed electric charge in the higher-permittivity insulation film.

In the present invention, it is preferable that each of the N-type MOSFET gate electrode 8a, P-type MOSFET gate electrode 9a, and top portion 8b of the gate electrode have a silicide crystal phase (stoichiometric composition). It is possible to realize a silicide crystal phase which is thermally and electrically stable by allowing these layers configuring the gate electrodes to have a stoichiometric composition. As a result, it is possible to suppress the range of variation in the device performance.

The first gate electrode includes a first silicide region including therein a silicide of metal M1, whereas the second gate electrode includes a second silicide region including therein a silicide of metal M2. Although the metals M1 and M2 may be of different metallic elements or the same metallic element, it is necessary that silicide of metal M1 be a material different from the silicide of metal M2. Thus, if the metals M1 and M2 are of the same metallic element, it is necessary that the silicide of metal M1 and silicide of metal M2 be different silicides having different compositions therebetween (silicides having different metal contents; or silicides having different silicon contents), It is preferable that the metals M1 and M2 for achieving the full silicidation of the gate electrode satisfy the following conditions:

(I) it is possible to obtain a full silicidation at a temperature at is which the impurities in the source/drain regions are not re-diffused; and (II) it is possible to form a plurality of crystal phases from a Si-rich crystal phase to a metal-rich crystal phase.

As the metal that satisfies the above condition (I), a metal is preferable which is capable of being silicidated at a temperature of 700° C. or below.

Since the work function of the silicide itself changes depending on the composition thereof by forming a plurality of crystal phases according to the above condition (II), control of the effective work function can be attained taking advantage of the composition change of the gate electrode made of silicides by forming a plurality of crystal phases.

It is preferable to use the above higher-permittivity material as the gate insulation film from the viewpoint of broadening the control range of the effective work function obtained by such compositions. As to the gate electrode which is formed on the gate insulation film having a higher dielectric constant, the region of the gate electrode in contact with the gate insulation film uses a Si-rich silicide as the second gate electrode for the N-type MOSFET, and a metal-rich silicide as the first gate electrode for the P-type MOSFET. This can achieve a wider range of variation in the effective work function depending on the composition change is compared to the case where $SiO_2$ is used as the gate insulation film.

More specifically, the above phenomenon is associated with the pinning of the Fermi level that occurs upon forming the gate electrode including therein silicon on the gate insulation film made of a higher-permittivity material. For example, if a Si-rich silicide electrode is formed on the higher-permittivity gate insulation film made of HfSiON, for example, the influence by pinning of the Fermi level occurring on the polysilicon/HfSiON interface before the silicidation remains without cancellation. Thus, the work function of the silicide electrode assumes a value near 4.1 to 4.3 eV, which is the pinning position of the Fermi level of the polysilicon electrode on the HfSiON. On the other hand, a higher concentration of the metal in the silicide electrode weakens the pinning of the Fermi level, whereby value of the substantially original work function of the silicide is reflected.

If gate electrodes including silicides having different crystal phases therebetween are formed in this way as the first gate electrode for the P-type MOSFET and the second gate electrode for the N-type MOSFET on the gate insulation film including a higher-permittivity material, there arises an alleviation effect for the pinning of the Fermi level, in addition to the change of work function of the silicide itself depending on the different compositions. Thus, a wider control range in the effective work function can be obtained as compared to the case of using $SiO_2$ as the gate insulation film. Such control of the effective work function is possible by providing a higher-permittivity insulation film in a portion of the gate insulation film in contact with the first and second gate electrodes, and providing a first silicide region including a silicide of metal M1 and a second silicide region including a silicide of metal M2 in a portion of the first and second gate electrodes, respectively, in contact with the gate insulation film.

Ni is preferable as the metal for the silicidation that satisfies the above conditions (I) and (II) described above. Use of Ni enables the polysilicon to be completely silicidated in an anneal process at a temperature of 650° C. or lower, whereby stepwise-different crystal phases can be formed only by changing the temperature in the anneal process and the amount of supplied Ni.

If a Ni silicide is used as the gate electrode material, the silicide of metal M1 is preferably $Ni_xSi_{1-x}$ ($0.6 \leq x < 1$), more preferably $Ni_xSi_{1-x}$ ($0.6 < x < 0.8$), and further more preferably $Ni_xSi_{1-x}$ ($0.7 < x < 0.8$).

In addition, the silicide of metal M2 included in the second gate electrode is preferably $Ni_ySi_{1-y}$ ($0 < y \leq 0.5$), more preferably $Ni_ySi_{1-y}$ ($0.25 < y < 0.45$), and further more preferably $Ni_ySi_{1-y}$ ($0.25 < y < 0.35$). It is to be noted that the crystal phase of Ni silicide is roughly classified into $NiSi_2$ crystal phase, NiSi crystal phase, $Ni_3Si_2$ crystal phase, $Ni_2Si$ crystal phase, $Ni_{31}Si_{12}$ crystal phase, and $Ni_3Si$ crystal phase.

In order to suppress the range of variation in the device characteristic to a minimum, it is preferable that a portion of the gate electrode in contact with the gate insulation film has a single crystal phase. Combinations of crystal phases achieving such a single crystal phase will be described hereinafter.

The first gate electrode has either of $Ni_3Si$ crystal phase and $Ni_2Si$ crystal phase, and the second gate electrode has either of NiSi crystal phase and $NiSi_2$ crystal phase.

Due to the above reason, the effective work function can be controlled in a wider range by forming at least a portion of the first and second gate electrodes in contact with the gate insulation film to have the above crystal phases, and forming at least a portion of the gate insulation film in contact with the gate electrodes from a higher-permittivity insulation film, such as a HfSiON film.

Mixed phases including the above crystal phases may be distributed in the gate electrodes depending on the thermal history during the silicidation. Thus, the average composition of the gate electrodes may be deviated to some degree from the stoichiometric composition. However, it is defined in this text that such a case is also within the range of compositions.

In the present invention, an optimum threshold Vth (0.3 to 0.5V) for a CMOS device that operates in a lower power dissipation can be achieved by employing the device structure wherein gate electrodes having Ni-silicide crystal phases and a gate insulation film made of the higher-permittivity insulation film are combined in this way.

It is possible to reduce the contact resistance of the gate electrodes by forming a low-resistance silicide film in the top portion of the gate electrodes. The low-resistance film which configures the top portion of the gate electrodes may be preferably configured by a Ni-monosilicide (NiSi) crystal phase. The Ni monosilicide is one of the silicides having a lowest resistivity among the silicide materials including Ni, and can suppress the overall resistance of the gate electrode line to a minimum by forming the NiSi layer in the top portion of the gate electrodes.

Hereinafter, an example of the manufacturing process of the semiconductor device according to the present invention will be described. This manufacturing method has features, differently from the conventional manufacturing process for the conventional semiconductor device, in the following points:

(a) impurities are injected only into a portion of the gate pattern, which is provided on the device isolation area formed on the semiconductor substrate, along the entire thickness direction of the gate pattern;

(b) a mask is provided on a portion of the of the gate pattern, into which impurities are injected, during the silicidation (including first silicidation and second silicidation) for forming the first and second gate electrodes.

In the manufacturing process of the present invention, due to the above features (a) and (b), the silicidation of the polysilicon area, which is heavily-doped with impurities and provided on the device isolation area, advances in a lateral direction (direction from N-type MOSFET gate electrode material toward P-type MOSFET gate electrode material; direction from P-type gate electrode material toward N-type MOSFET gate electrode material; extending direction of the linear gate electrode; and direction perpendicular to the gate-length direction and parallel to the semiconductor substrate). As a result, a polysilicon region (impurity-doped region) including impurities at a high concentration is formed in the gate electrode line on the device isolation area, along the entire thickness direction of the gate electrode line (direction perpendicular to the semiconductor substrate).

On the other hand, in the conventional semiconductor device, the silicidation for forming mainly the gate electrode advances in the thickness direction of the gate pattern. Thus, the region which includes impurities at a high concentration is not formed, or an extremely thin layer is formed only in the vicinity of the gate insulation film.

The silicide of metal M1 and silicide of metal M2 preferably have silicide crystal phases having a stoichiometric composition. In order to form such silicide crystal phases, a metallic film is deposited on the polysilicon and thermally treated using a full-silicidation technology which completely silicidates the polysilicon. Use of the full-silicidation technology allows the silicide crystal phases to be formed in a self-alignment manner, thereby providing a stoichiometric composition for the silicide composition.

For example, if Ni is used as the metals M1 and M2, a $Ni_2Si$ crystal phase or $Ni_3Si$ crystal phase may be preferably formed as the silicide of metal M1, and a NiSi crystal phase or $NiSi_2$ crystal phase may be preferably formed as the silicide of metal M2.

The conditions for forming these Ni-silicide crystal phases to be quoted include: (1) the ratio, TNi/TSi, of the thickness TNi of the Ni film (thickness of an embedded insulation film in the direction perpendicular thereto) to be deposited on the polysilicon gate pattern to the thickness TSi of the gate pattern; and (2) the annealing temperature upon silicidation (first silicidation and second silicidation).

More concretely, Table 1 shows the relationship between the above condition (1) or (2) and the composition of the crystal phases of Ni-silicide.

TABLE 1

| | | TNi/TSi | | | |
|---|---|---|---|---|---|
| | | 0.33 | 0.67 | 1.20 | 1.80 |
| Annealing Temperature (° C.) | 650 | $NiSi_2$ + NiSi | | | |
| | 600 | NiSi | | | |
| | 500 | NiSi | NiSi | | NiSi + $Ni_3Si$ |
| | 450 | NiSi | NiSi | | NiSi + $Ni_3Si$ |
| | 400 | | NiSi | NiSi | NiSi + $Ni_3Si$ |

Thus, the Ni silicide of the target composition can be obtained by adjusting the conditions upon the silicidation while taking into consideration the relationship between the TNi/TSi and annealing temperature and the Ni-silicide composition as shown in Table 1. The heat treatment requires a non-oxidation ambient for preventing oxidization of the metallic film.

A condition of $0.55 \leq TNi/TSi \leq 0.95$ may be exemplified as the typical condition for obtaining the NiSi crystal phase. A temperature upon silicidation (annealing temperature), which is not higher than 650° C., and $0.28 \leq TNi/TSi \leq 0.54$ may be exemplified as the typical condition for obtaining the $NiSi_2$ crystal phase.

$1.60 \leq TNi/TSi$ may be exemplified as the typical condition for obtaining the $Ni_3Si$ crystal phase.

On the other hand, it may be considered to use a CVD technique as the process for forming the gate electrode configured by the silicide, as described in JP-1996-130216A. However, use of the CVD technique requires control of the silicide composition by controlling the flow rate ratio of the process gasses and process temperature, which renders the self-alignment control of the silicide composition difficult. Thus, it is more difficult to obtain a stoichiometric composition for the gate electrodes as compared to the above full-silicidation technology. In addition, a heat treatment performed in the manufacturing process of the semiconductor device is likely to cause a phase separation in the silicide, to raise a possibility of increase of the range of variation in ID the device performance. Thus, the silicidation by using above manufacturing process is preferable.

EXAMPLE-1

Figure 9A:
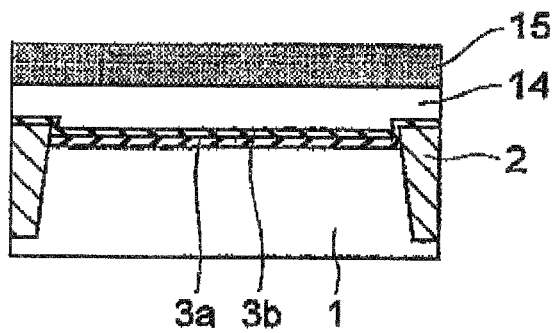
FIG. 9A is a sectional view of a semiconductor device in a process step of fabrication process according to an example of the present invention.
Figure 9B:
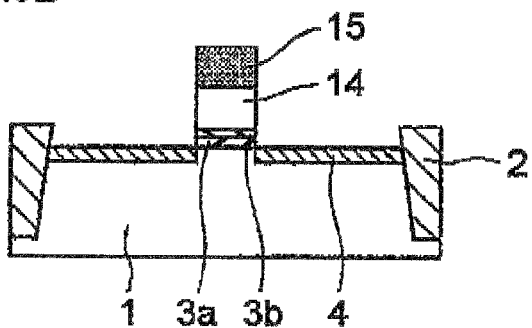
FIG. 9B is a sectional view showing the process step subsequent to FIG. 9A.

FIGS. 9A-9G are sectional views showing a manufacturing process of the semiconductor device according to the present example. It is to be noted that FIGS. 9A-9G show only the manufacturing process for the N-type MOSFET for simplification, without showing the manufacturing process for the P-type MOSFET. First, a silicon substrate 1 including an N-type area and a P-type area was prepared. As shown in FIG. 9A, using a STI (shallow trench isolation) technique on the surface area of the silicon substrate 1, a device isolation area 2 was formed so that the N-type area and the P-type area were isolated from each other by the device isolation area 2. Thereafter, an insulation film 3 (3a, 3b) was formed on the surface of the silicon substrate subjected to the device isolation. This insulation film had a structure configured by a silicon oxide film 3a and a higher-permittivity insulation film 3b.

In the present example, the insulation film having a composition of HfSiO and $SiO_2$ is formed wherein the Hf concentration in the insulation film changed along the depth-wise direction, the Hf concentration in the vicinity of the interface between the gate electrode and the gate insulation film was the highest, the average Hf concentration ratio, Hf/(Hf+Si), in the HfSiON film was 0.5, and the vicinity of the interface between the silicon substrate and the gate insulation film had a composition of a thermally-oxidized silicon film.

In order to obtain the above insulation films, a 1.9 nm thermally-oxidized silicon film 3a is first formed, followed by depositing a 0.5 nm Hf by using a long-slow sputtering technique, and performing a two-step heat treatment in an oxygen ambient at 500° C. for one minute and in a nitrogen ambient at 800° C. for 30 seconds, to allow the Hf to diffuse in a solid phase into the underlying silicon oxide film, thereby forming the HfSiO film. Thereafter, a nitriding anneal treatment was performed in a $NH_3$ ambient at 900° C. for 10 minutes to obtain the HfSiON film 3b.

Subsequently, a layer structure including a 60-nm-thick polysilicon film 14 and a 60-nm-thick silicon oxide film 15 was formed on the insulation film, followed by patterning the layer structure by using lithographic technique and RIE (reactive ion etching) technique, to form a gate insulation film and a gate pattern corresponding to dimensions of the gate electrode and extending from the N-type region via the device isolation area toward the P-type area.

Subsequently, ion implantation was performed to the N-type area and P-type area by using the polysilicon film 14 and silicon oxide film 15 as a mask, to thereby form an extension diffused region 4 in each area in a self-alignment manner.

Figure 9C:
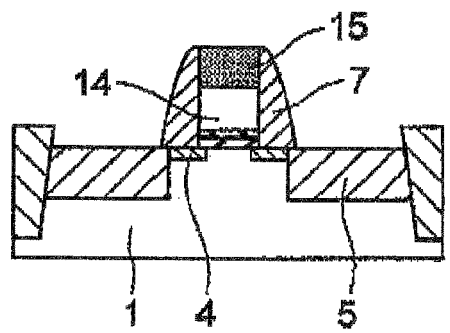
FIG. 9C is a sectional view showing the process step subsequent to FIG. 9B.

Subsequently, as shown in FIG. 9C, a silicon oxide film was deposited and thereafter etched back to form a gate sidewall 7 on the side surface of the polysilicon film and silicon oxide film. Ion implantation was again performed to the N-type area and P-type area in this state, to form source/drain regions 5 after performing an activation anneal.

Figure 9D:
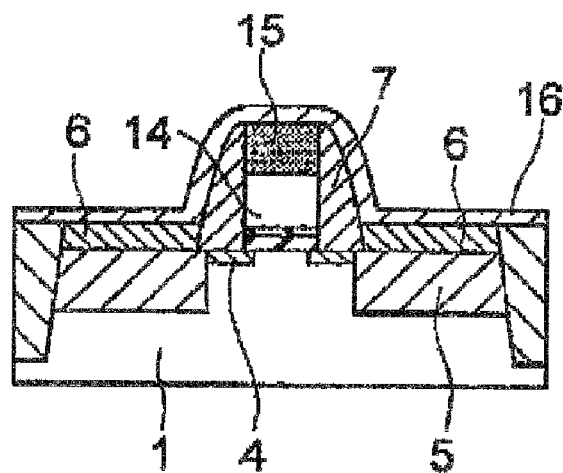
FIG. 9D is a sectional view showing the process step subsequent to FIG. 9C.

Subsequently, as shown in FIG. 9D, a 10-nm-thick metallic film 16 was deposited on the entire surface by sputtering. A Co film was used as this metallic film 16. Thereafter, a heat treatment is conducted using the gate sidewall film 7 and silicon oxide film 15 on the gate electrode and device isolation area 2 as a mask, to form a 30-nm-thick cobalt disilicide ($CoSi_2$) film 6 on the source/drain regions 5. This Co film can reduces the contact resistance of the source/drain regions 5.

Figure 9E:
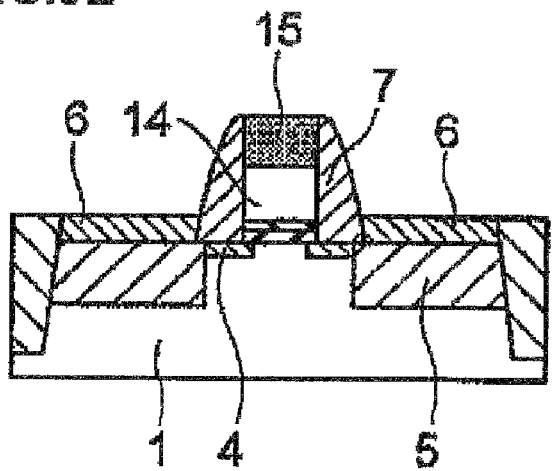
FIG. 9E is a sectional view showing the process step subsequent to FIG. 9D.
Figure 10A:
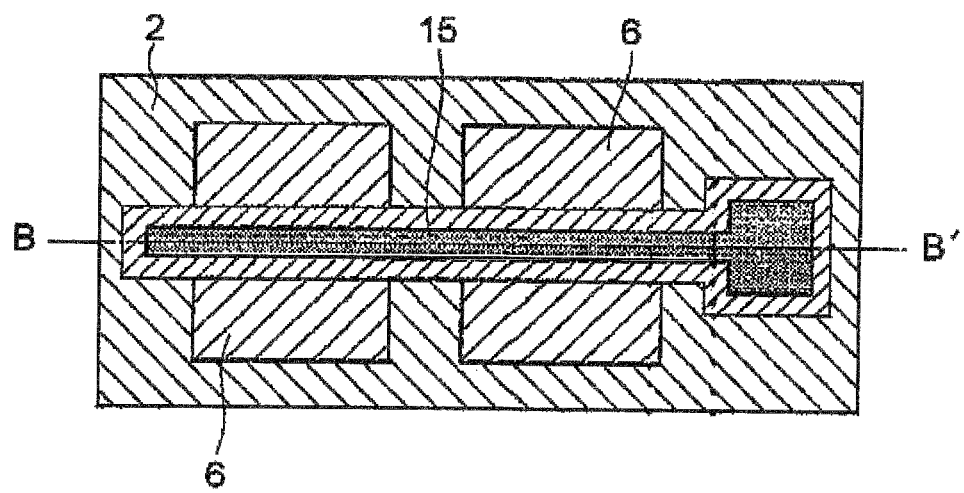
FIG. 10A is a top plan view of a semiconductor device in a process step of a fabrication process according to another example of the present invention.
Figure 10B:
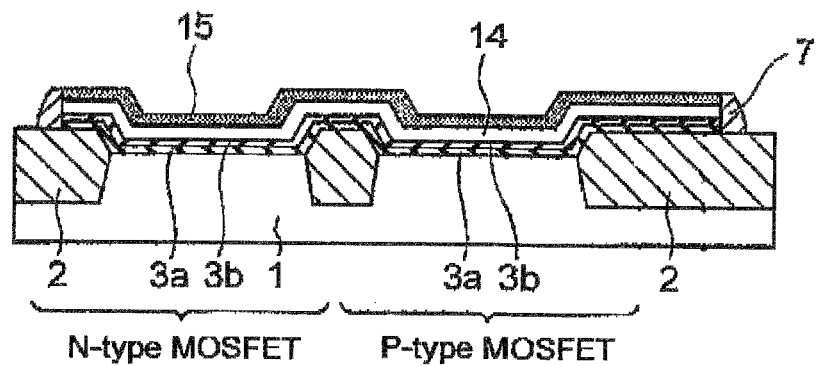
FIG. 10B is a B-B' sectional view in the process step of FIG. 10A.

Finally, an excessive Co film 16 which was not silicidated in the heat treatment was removed by wet etching using a sulfuric-acid and hydrogen-peroxide solution (FIG. 9E). FIG. 10A shows a top plan view of the semiconductor device, and FIG. 10B shows a sectional view taken perpendicular to the semiconductor substrate, at this stage. As shown in FIGS. 10A and 10B, in the present example, the first and second gate electrodes for the N-type MOSFET and P-type MOSFET, respectively, are provided within the gate electrode line.

Figure 9F:
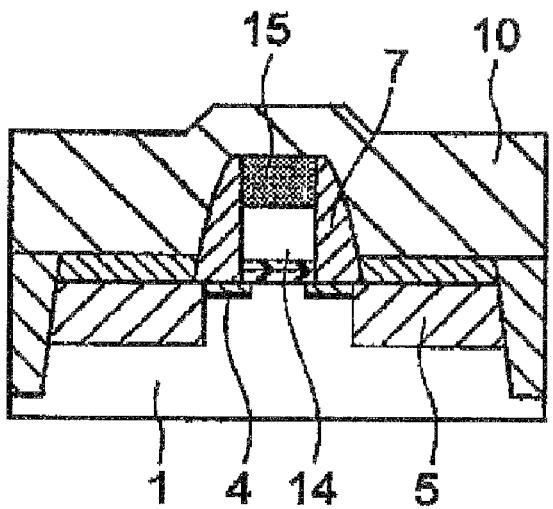
FIG. 9F is a sectional view showing the process step subsequent to FIG. 9E.
Figure 10C:
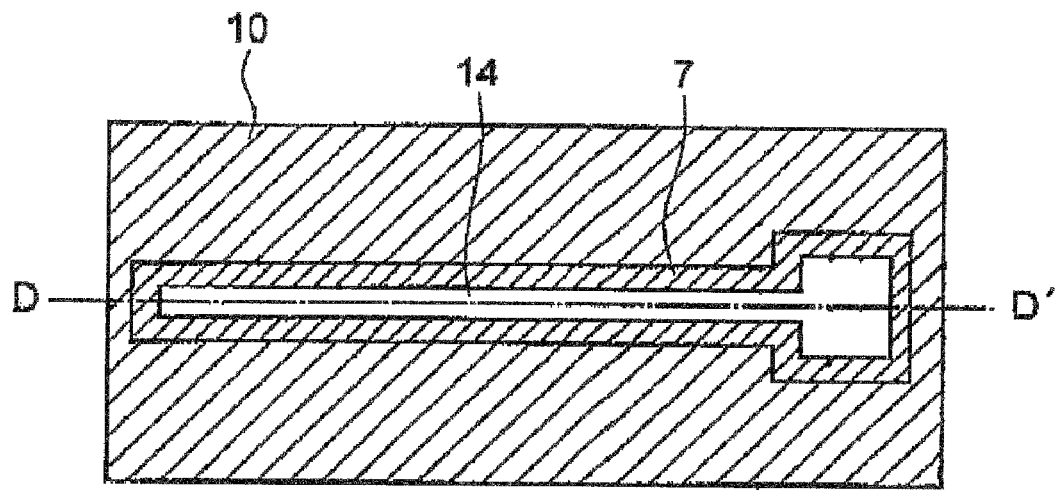
FIG. 10C is a top plan view showing the process step subsequent to FIG. 10A.
Figure 10D:
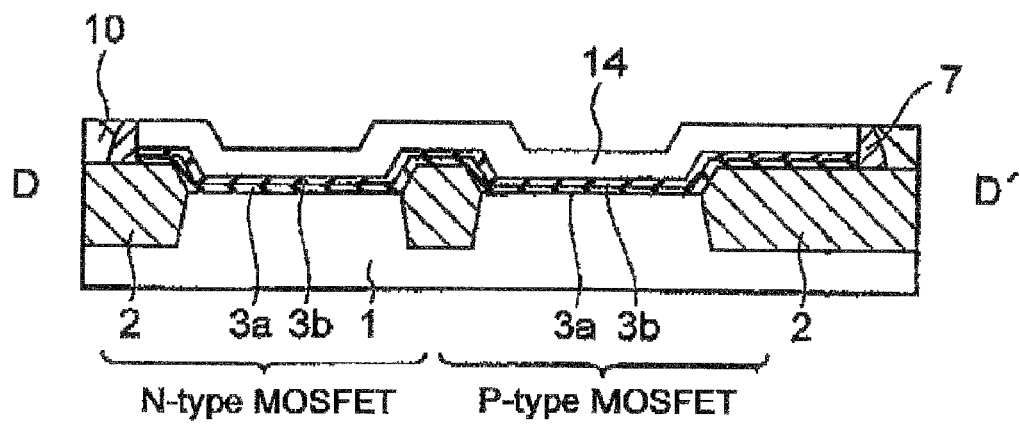
FIG. 10D is a D-D' sectional view in the process step of FIG. 10C.

Subsequently, as shown in FIG. 9F, an interlayer dielectric film 10 made of silicon oxide film was formed using a CVD (chemical vapor deposition) technique. This interlayer dielectric film 10 was subjected to planarization using a CMP (chemical-mechanical polishing) technique, as shown in FIG. 9O, followed by etch back of the vicinity of top of the interlevel dielectric film 10 by using a HF-solution treatment to expose the top surface of the polysilicon film 14. FIG. 10C shows a top plan view of the semiconductor device, and FIG. 10D shows a sectional view taken perpendicular to the semiconductor substrate, at this stage.

Figure 9G:
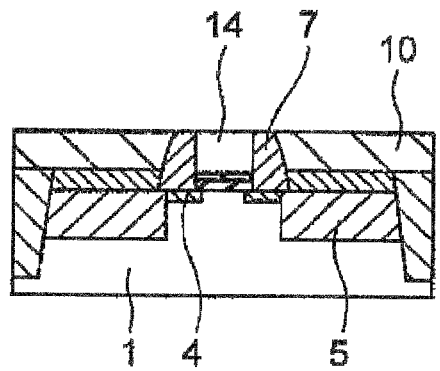
FIG. 9G is a sectional view showing the process step subsequent to FIG. 9F.
Figure 11A:
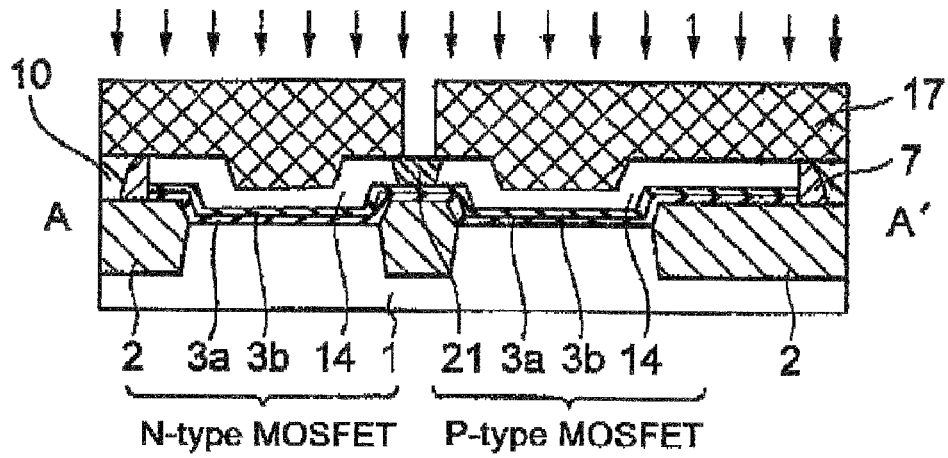
FIG. 11A is a sectional view of a semiconductor device in process step of a fabrication process according to another example of the present invention.

FIGS. 11A to 11F consecutively show steps subsequent to FIG. 9G in the manufacturing process of the semiconductor device according to the present example in sectional views taken perpendicular to the channel-length direction of the MOSFET. Subsequently, as shown in FIG. 11A, a mask pattern is formed from photoresist so that the gate pattern on the device isolation area is exposed. Ion implantation of impurities was performed so that impurities were distributed over the entire thickness direction of the gate pattern of the polysilicon formed on the device isolation area, to form an impurity-implanted region 21.

Base on the impurities implanted into the gate pattern, the gate electrode forming step (silicidation step) performed later forms the impurity-implanted region 21 which prevents diffusion of constituent materials of the gate electrodes in the lateral direction (direction from the N-type MOSFET gate electrode toward the P-type MOSFET gate electrode; direction from the P-type MOSFET gate electrode toward the N-type MOSFET gate electrode; extending direction of the linear gate electrode; and direction perpendicular to the gate-length direction and parallel to the semiconductor substrate).

Boron, arsenic, a phosphor, antimony, nitrogen, carbon or fluorine may be used as the species of impurities implanted into the gate pattern. Among them, antimony, arsenic, a phosphor, and boron may be quoted as preferable impurity elements in the order of preference. Antimony, arsenic, phosphor and boron, if implanted into polysilicon at a high concentration, do not cause a higher resistance and are not aggregated. Among those impurity elements, an impurity element having a larger atomic radius has a higher effect of preventing diffusion of the metallic element during the silicidation.

In the present example, antimony (Sb) was implanted at 30 keV so that the concentration of antimony in the gate pattern of the polysilicon formed on the device isolation area assumed $3 \times 10^{20}$ $cm^{-3}$. In this case, it is needed that the ion implantation of impurities be performed at the implanted position within the gate pattern so that the impurity-doped region 20 is formed only on the device isolation area (it is necessary to form the final thickness T1 of the impurity-doped region 20 which is smaller than the width T2 of the device isolation area).

The reason is that the first and second gate electrodes are formed by separate steps of silicidation of the gate pattern on the N-type area and P-type area in later anneal processing. During the process, the impurity element implanted on the device isolation area is also diffused along with the silicidation of gate pattern, toward the gate pattern on another active area which is not subjected to the silicidation. More concretely, the Impurities are diffused also in a lateral direction, and this diffusion length is equivalent to the height of the polysilicon gate pattern provided beforehand. Thus, the ion implantation should be performed so that impurity-doped region 20 is formed only on the device isolation area, taking into consideration diffusion of the impurity element during such this anneal.

In the present example, the height of the polysilicon gate pattern was set at 60 nm. Thus, it is necessary to implant Sb into the polysilicon gate pattern formed on the device isolation area while taking into consideration the lateral diffusion of the impurities, implanted into the polysilicon gate pattern, in the later anneal process by a range of 60 nm or less. More concretely, in the present example, the ion implantation of impurities was performed to the inner area which is 60 mm or less apart from the end of the gate pattern on the device isolation area.

Figure 11B:
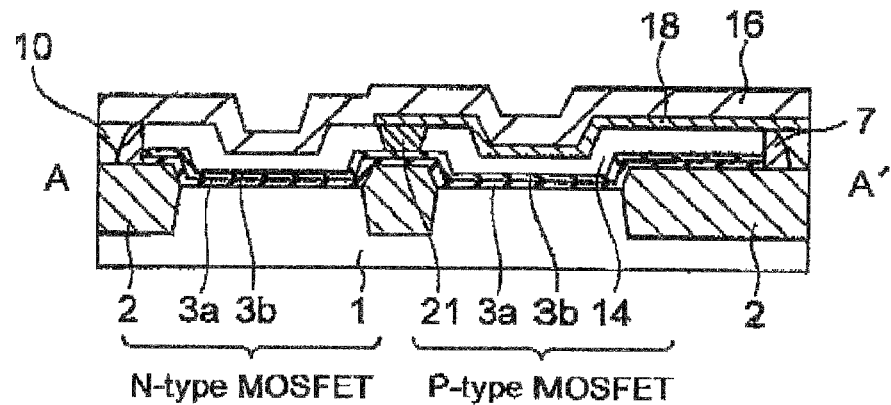
FIG. 11B is a sectional view showing the process step subsequent to FIG. 11A.

Subsequently, as shown in FIG. 11B, a silicidation preventing film 18 (mask (A)) for preventing the silicidation was provided on the part from a portion of the polysilicon gate pattern on the device isolation area (impurity-implanted region 21) into which the ion implantation is performed to a portion of the gate electrode pattern to be formed as the first gate electrode for the P-type MOSFET. In this step, the silicidation preventing film 18 should be selected from materials that can prevent diffusion of the metal silicidated during the silicidation process (thermal treatment; anneal process) and have itself a stability. In addition, it is preferable to employ, as the silicidation preventing film 18, a material that is selectively etched from the silicidated metal and the interlayer dielectric film, because the device fabrication process is simplified. In the present example, 20 nm TiN was deposited as the silicidation preventing film at 300° C. by using a reactive-ion sputtering process.

Subsequently, a metallic film (M2 film) 16 that is a target for the silicidation is deposited in the entire area on the gate pattern 14 made of polysilicon to be formed as the second gate electrode for the N-type MOSFET. The material of the metallic film may be selected from metals that can form a silicide in association with the polysilicon 14, for example, Ni, Pt, Hf, V, Ti, Ta, W, Co, Cr, Zr, Mo, Nb, or alloys of these metals. It is preferable that the material can be completely silicidated at a temperature at which a phase change or aggregation that causes a higher resistance does not occur on the silicide film formed on the source/drain regions 5.

More concretely, it is preferable to select a metal that can be silicidated at a temperature below 500° C. if the silicide foamed on the source/drain regions 5 is a Ni silicide, and below 700° C. if the silicide is a Co silicide. In addition, it is preferable that the material can form a plurality of crystal phases from a Si-rich crystal phase to a metal-rich crystal phase within such a temperature range. In the present example, a Ni film was used as the metallic film (M2 film) 16 for the full silicidation.

In the present example, when the polysilicon film 14 well reacted with Ni for silicidation, the film thickness of Ni was set so that the average silicide composition of the N-type MOSFET gate electrode assumes $Ni_xSi_{1-x}$ (0.25<x<0.35). Preferably, the film thickness is set so that a portion of the Ni-silicide film in contact with the gate insulation film after the silicidation reaction includes a $NiSi_2$ crystal phase as the main component thereof. In the present example, Ni was deposited up to 20 nm at room temperature by a DC magnetron sputtering technique.

Figure 11C:
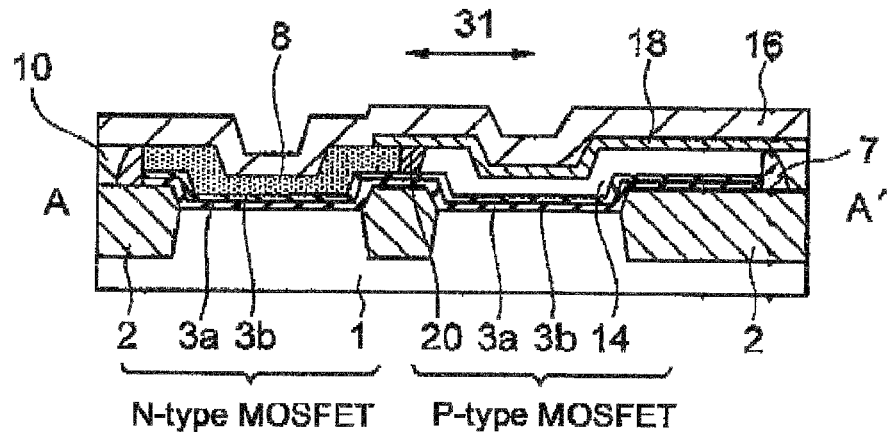
FIG. 11C is a sectional view showing the process step subsequent to FIG. 11B.

Subsequently, a heat treatment (anneal process) was performed for silicidating the polysilicon film 14 and Ni film 16 on the gate insulation film (FIG. 11C). This heat treatment silicidated the N-type MOSFET gate pattern along the entire thickness direction thereof (direction perpendicular to the semiconductor substrate), to form a $NiSi_2$ crystal phase. The silicidation was performed until the silicidation laterally advances to reach the region of the polysilicon gate pattern to which the impurities are implanted, and silicidated the region of the polysilicon gate pattern on the device isolation area while advancing in a lateral direction (direction from the N-type MOSFET area toward the P-type MOSFET area; extending direction of the linear gate electrode; direction perpendicular to the gate-length direction and parallel to the semiconductor substrate) 31, thereby segregating the impurities in the polysilicon on the device isolation area for an increased concentration. This first silicidation changes a region of the gate pattern on the P-type area and a region of the gate pattern on the device isolation area except for a region of the gate pattern on the impurity-implanted region 21 and N-type area (region of the gate pattern on the device isolation area nearer to the P-type area than the impurity-implanted region 21), into a second silicide region including a silicide of metal M2.

It is preferable to perform the heat treatment in the following conditions:
(a) in a non-oxidizing ambient for prevention of oxidation of the Ni film;
(b) in a temperature range to obtain a sufficient diffusion rate for complete silicidation of the polysilicon 14 on the P-type area;
(c) in a temperature range not to cause re-diffusion of the impurities in the extended diffused region 4 and source/drain regions 5; and
(d) in a temperature range in which the silicide film formed on the source/drain regions beforehand for reducing the contact resistance is not changed in the phase thereof to assume a higher resistance.

In the manufacturing process of the present invention, due to forming a cobalt silicide ($CoSi_2$) as the silicide film (S/D silicide film) on the source/drain regions to reduce the contact resistance, the allowable temperature of the S/D silicide film is around 700° C. Thus, in the present example, 650° C. and one minute was employed as the condition for the heat treatment in which the $NiSi_2$ crystal phase can be obtained.

The gate electrode 8 formed in the full-silicidation condition of the present example, such as shown in FIG. 11C, was measured using an X-ray diffraction (XRD) measurement, to clearly exhibit a peak from a $NiSi_2$ crystal phase. A Rutherford-back-scattering (RBS) measurement also assured that the composition ratio of Ni to Si was 1:2 on the interface between the gate electrode and the gate insulation film.

The gate electrode, which was formed in the present example and included a Ni silicide having a $NiSi_2$ crystal phase as the main component thereof, has an effective work function of 4.4 to 4.5 eV on the HfSiON. Since the optimum effective work function of a low-power-dissipation N-type MOSFET is 4.4 to 4.5 eV, the gate electrode having the NiSi2 crystal phase is suited to the gate electrode of the low-power-dissipation N-type MOSFET.

Subsequently, a wet etching was performed to remove an excessive Ni film (M2 film) 16, which was not silicidated in the heat treatment using the sulfuric-acid and hydrogen-peroxide solution, and the silicidation preventing film (mask (A)) 18. Peel-off of the second gate electrode from the gate insulation film was not observed at all through the above removal process.

Figure 11D:
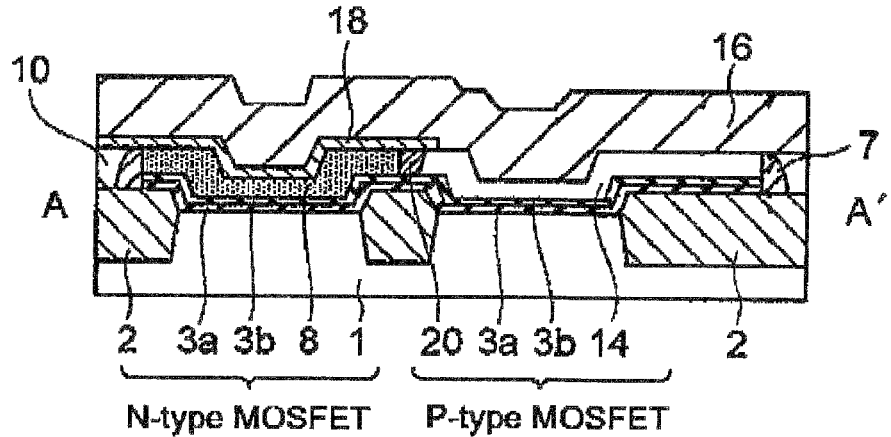
FIG. 11D is a sectional view showing the process step subsequent to FIG. 11C.

Subsequently, as shown in FIG. 11D, another silicidation preventing film (mask (B)) 18 for preventing re-silicidation was formed on a portion of the gate pattern from a gate pattern section (on the P-type area) to be formed as the N-type MOSFET gate electrode to the impurity-implanted region. A 20-nm TiN film was used as the silicidation preventing film 18 for the reason as described before, and deposited using a reactive-ion sputtering technique at 300° C. Thereafter, a metallic film (M1 film) 16 for silicidating a portion of the polysilicon gate pattern 14 to be formed as the P-type MOSFET polysilicon gate was deposited on the entire surface.

A metallic film 16 for the full silicidation is also formed by depositing a Ni film for the reason as described before. The film thickness of Ni was set so that the average composition of the gate electrode silicide assumes $Ni_ySi_{1-y}$ (0.7<y<0.8) after the polysilicon film 14 completely reacted with Ni for silicidation. Preferably, the film thickness is set so that a portion of the Ni-silicide film in contact with the gate insulation film after the silicidation reaction includes a $Ni_3Si$ crystal phase as the main component thereof.

Figure 11E:
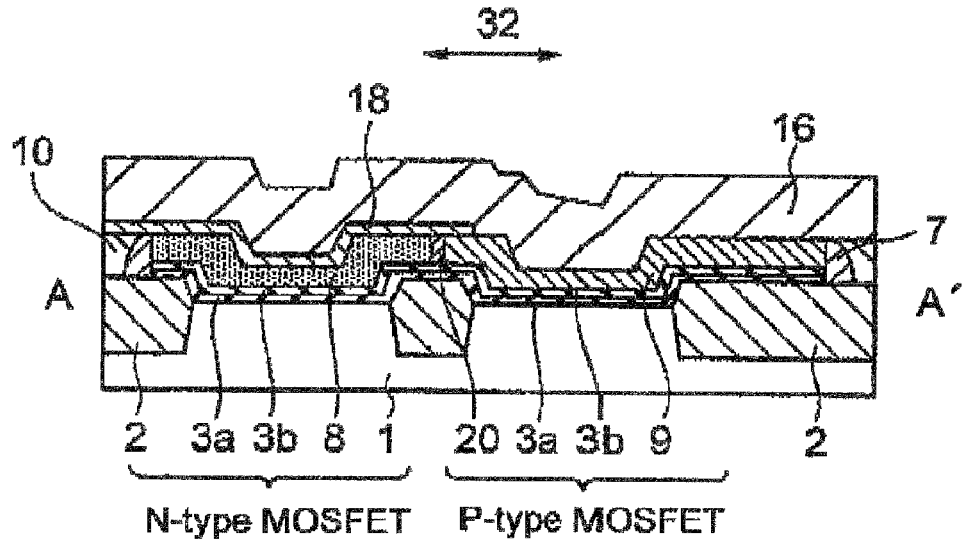
FIG. 11E is a sectional view showing the process step subsequent to FIG. 11D.

In the present example, the Ni film (M1 film) was deposited to a thickness of 100 nm at room temperature by a DC magnetron sputtering technique. Subsequently, a heat treatment (anneal process) for silicidating the polysilicon film 14 and Ni film 16 on the gate insulation film was performed (FIG. 11E). In this heat treatment, the gate pattern in the P-type MOSFET area was silicidated along the entire thickness direction (direction to perpendicular to the semiconductor substrate), to form a $Ni_3Si$ crystal phase. This silicidation was performed until the silicidation advances in a lateral direction to reach a region of the polysilicon gate pattern into which impurities had been implanted. More specifically, a region of the polysilicon gate pattern on the is device isolation area was silicidated while advancing the silicidation from the P-type MOSFET area in a lateral direction (direction from the P-type MOSFET MOSFET silicon toward the second gate electrode for the N-type MOSFET; extending direction of the linear gate electrode; direction perpendicular to the gate-length direction and parallel to the semiconductor substrate) 32, thereby segregating the impurities in the polysilicon on the device isolation area for obtaining an increased impurity concentration, to thereby form a impurity-doped region. This second silicidation changes at least a region of the gate pattern on the N-type area and a region of the gate pattern on the device isolation area, except for a region of the gate pattern on the impurity-implanted region 21 and P-type area (region of the gate pattern on the device isolation area nearer to the N-type area than the impurity-implanted region 21), into a second silicide region including a silicide of metal M1. It is preferable that the conditions of the heat treatment satisfy the above conditions (a) to (d).

At this stage, it is preferable that the concentration of impurities included in the impurity-doped region 20 be considerably higher than the impurity concentration in the polysilicon gate pattern provided beforehand as the MOSFET gate electrode materials and the impurity concentration in the first and second gate electrodes. This is because the rate at which silicidation of the polysilicon advances depends on the impurity concentration and a higher impurity concentration decelerates the silicidation. As a result, a higher impurity concentration in the impurity-doped region 20 suppresses diffusion of the metal silicides having different compositions, thereby suppressing the phase change caused by the bidirectional diffusion of the silicides having different compositions and configuring the first and second gate electrodes.

More concretely, the concentration of impurities included in the impurity-doped region is preferably equal to or higher than $1 \times 10^{20}$ cm$^{-3}$. Employment of this impurity concentration equal to or above $1 \times 10^{20}$ cm$^{-3}$ is to effectively obtain an impurity concentration lower than the impurity concentration of the first and second gate electrodes. The impurity concentration is more preferably equal to or higher than $1 \times 10^{21}$ cm$^{-3}$. Since the main component of the impurity-doped region 20 is silicon, the concentration equal to or higher than $1 \times 10^{21}$ cm$^{-3}$ is close to the solid solubility limit of impurities in silicon. Due to inclusion of the impurities at a concentration of $1 \times 10^{20}$ cm$^{-3}$ or above, this impurity-doped region does not allow the metal to be diffused therein during the silicidation. The impurity concentration is more preferably equal to or higher than $1 \times 10^{22}$ cm$^{-3}$. This impurity concentration is higher than the solid solubility concentration of impurities in the impurity-doped region. Thus, diffusion of the metal for silicidation into the impurity-doped region does not occur, whereby a stable interface between the silicides having different compositions can be formed on the device isolation area.

In the present example, a cobalt silicide ($CoSi_2$) was formed on the source/drain regions as the silicide film (S/D silicide film) for reducing the contact resistance. The allowable temperature of this S/D silicide film is around 700° C. Thus, a condition of nitrogen gas ambient, 400° C. and five minutes that is capable of obtaining a $Ni_3Si$ crystal phase was employed for the heat treatment in the present example.

The gate electrode 9 formed in the full-silicidation condition of the present example, such as shown in FIG. 11E, was measured using an X-ray diffraction (XRD) measurement, to clearly exhibit a peak from the $Ni_3Si$ crystal phase. A Rutherford-back-scattering (RBS) measurement also assured that the composition ratio of Ni to Si was 3:1 on the interface between the gate electrode and the gate insulation film.

The gate electrode, which was formed in the present example and included a Ni silicide having a $Ni_3Si_2$ crystal phase as the main component thereof, has an effective work function of 4.7 to 4.8 eV on the HfSiON. Since the optimum effective work function of a low-power-dissipation P-type MOSFET is 4.7 to 4.8 eV, the gate electrode having the $Ni_3Si$ crystal phase is suited to the gate electrode of the low-power-dissipation P-type MOSFET.

Figure 11F:
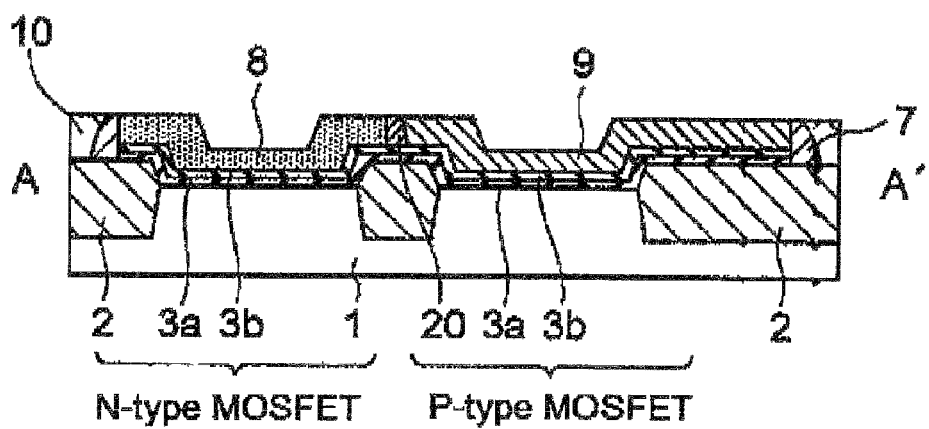
FIG. 11F is a sectional view showing the process step subsequent to FIG. 11E.

Finally, a wet etching using a sulfuric-acid and hydrogen-peroxide solution was performed to remove an excessive Ni film 16, which was not silicidated in the heat treatment, and the silicidation preventing film 18 (FIG. 11F). Peel-off of the gate electrode from the gate insulation film was not observed at all through the above removal process.

EXAMPLE-2

The present example relates to a CMOS device having an improved device characteristic, which includes the second gate electrode for the N-type MOSFET including a film having a $NiSi_2$ crystal phase and an overlying low-resistance film (film having a NiSi crystal phase). FIGS. 12A to 12G are sectional views showing a manufacturing process of the MOSFET in the present example.

Figure 12A:
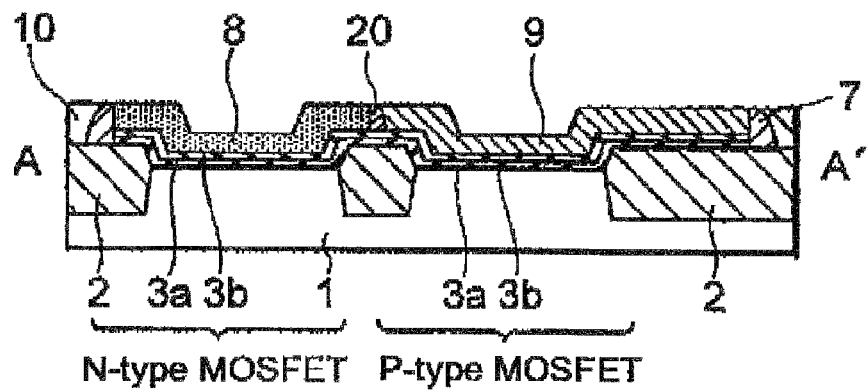
FIG. 12A is a sectional view of a semiconductor device in process step of a fabrication process according to another example of the present invention.

First, performing a process similar to the process for the above Example-1, as shown in FIG. 12A, the first gate electrode having a $NiSi_2$ crystal phase and the second gate electrode having a $Ni_3Si$ crystal phase are formed on the P-type area and N-type area, respectively.

Figure 12B:
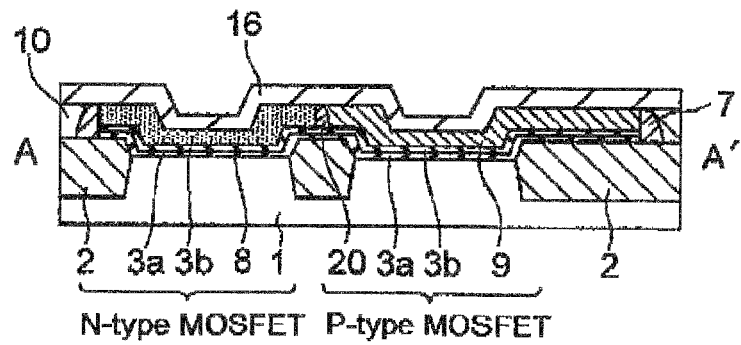
FIG. 12B is a sectional view showing the process step subsequent to FIG. 12A.

Subsequently, as shown in FIG. 12B, a 10-nm-thick metallic film 16 was deposited on the entire surface by sputtering. A Ni film was used as the metallic film 16. Since this Ni film is deposited also on top of the second gate electrode 8 (second silicide region) having a $NiSi_2$ crystal phase, performing an anneal processing allows the $NiSi_2$ crystal phase to react with Ni, to form a low-resistance film 12 having a NiSi crystal phase (nickel-monosilicide film: low-resistance film) on top of the $NiSi_2$ crystal phase in the second gate electrode for the N-type MOSFET (third silicidation).

On the other hand, since the first gate electrode for the P-type MOSFET has a $Ni_3Si$ crystal phase at this stage, the deposition of Ni on top of this $Ni_3Si$ crystal phase and a subsequent heat treatment cannot form a further-Ni-rich crystal phase, whereby Ni cannot be diffused into the $Ni_3Si$ film.

Figure 12C:
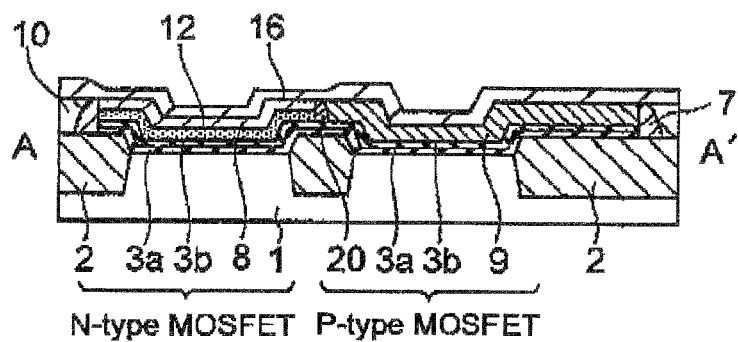
FIG. 12C is a sectional view showing the process step subsequent to FIG. 12B.

Concretely, the third silicidation is performed as a heat treatment using the gate sidewall film 7 and device isolation area 2 as a mask, to form a 30-nm-thick Ni-monosilicide (NiSi) film 12 on top of the $NiSi_2$ crystal phase (FIG. 12C). At this stage, the temperature of heat treatment for reacting the second gate electrode 8 of $NiSi_2$ with the Ni film 16 should satisfy the following conditions:

(A) a temperature not to cause phase change of the $CoSi_2$ film 6 formed on the source/drain regions 5 to have a higher resistance;

(B) a temperature to cause a Ni silicide film 12 formed on the $NiSi_2$ crystal phase to change into a low-resistance NiSi crystal phase (Ni-monosilicide phase), due to the Ni diffused into the $NiSi_2$ crystal phase which configures the second gate electrode.

Figure 12D:
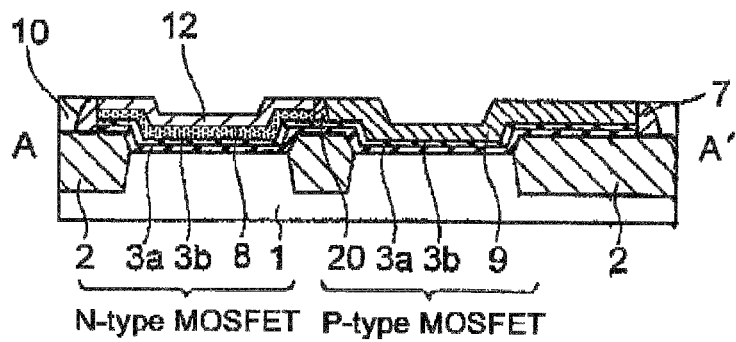
FIG. 12D is a sectional view showing the process step subsequent to FIG. 12C.

Concretely, it is preferable to set the temperature of heat treatment at 350 to 450° C. In the present example, the heat treatment was performed in a nitrogen gas ambient at 400° C. for 5 minutes. Subsequently, as shown in FIG. 12D, an excessive Ni film which is not reacted for silicidation in the heat treatment was removed by wet etching using a sulfuric-acid and hydrogen-peroxide solution.

Figure 12E:
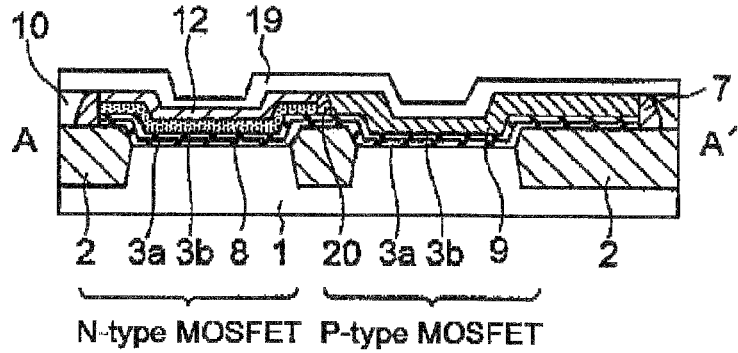
FIG. 12E is a sectional view showing the process step subsequent to FIG. 12D.
Figure 12F:
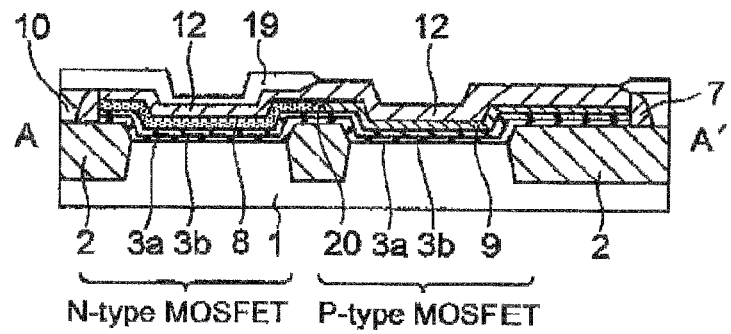
FIG. 12F is a sectional view showing the process step subsequent to FIG. 12E.

Subsequently, as shown in FIG. 12E, a 10-nm-thick silicon film 19 was deposited on the entire surface by sputtering. Thereafter, performing an anneal processing, as shown in FIG. 12F, the top portion of the first gate electrode 9 (first silicide region) having a $Ni_3Si$ crystal phase is reacted with the silicon film 19 deposited thereon, to selectively form a film 12 having a NiSi crystal phase (Ni-monosilicide film: low-resistance film) on top of the $Ni_3Si$ crystal phase (fourth silicidation). At this stage, the temperature of heat treatment for reacting the first gate electrode 9 of $Ni_3Si$ with the silicon film 19 preferably satisfy the following conditions:

(C) a temperature not to cause the NiSi film 6 formed on the source/drain regions 5 and NiSi film 12 formed on the second gate electrode for the N-type MOSFET to assume a high-resistance phase due to the phase change; and (D) a temperature to change the Ni-silicide film 12 formed on top of the Ni$_3$Si crystal phase into a low-resistance NiSi crystal phase (Ni-monosilicide phase) due to the Ni diffused into the Ni$_3$Si crystal phase configuring the first electrode.

Figure 12G:
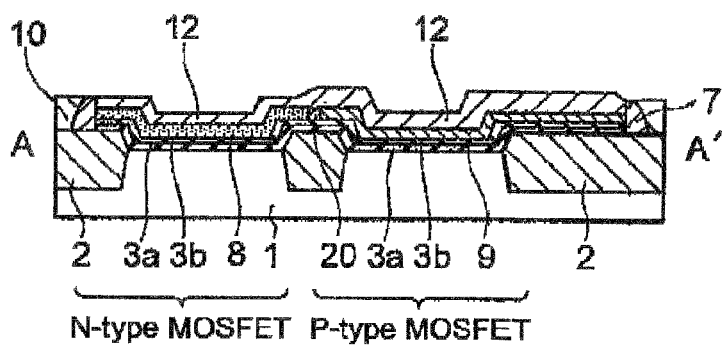
FIG. 12G is a sectional view showing the process step subsequent to FIG. 12F.

Concretely, it is preferable to set the temperature of heat treatment at 350 to 450° C. In the present example, the heat treatment was performed in a nitrogen gas ambient at 400° C. for 5 minutes. Finally, as shown in FIG. 12G, an excessive silicon film 19 which had not reacted in the heat treatment was removed by dry etching.

Through the above processing, as shown in FIGS. 11F and 12C, the impurity-doped region for preventing the phase change of the silicide gate electrodes caused by bidirectional diffusion of Ni was formed on the interface on which the second gate electrode 8 having a NiSi$_2$ crystal phase and the first gate electrode 9 having a Ni$_3$Si crystal phase form a joint on the device isolation area. Acquisition of such a device structure leads to achievement of an optimum threshold Vth (0.3 to 0.5V) without a significant range of variation in a low-power-dissipation CMOS device, and to reduction of the contact resistance in the gate electrode. As a result, a low-power-dissipation CMOS device operating at a higher speed with a higher stability can be realized.

In addition to the above, as shown in FIG. 12C, a stacked gate structure including a low-resistance film 12 having a NiSi crystal phase in the top portion of both the gate electrodes can be obtained. Due to formation of the film-like low-resistance silicide region provided in the top portion of the gate electrodes, the gate electrode line has a smaller overall line resistance. In addition, by configuring the bottom portion and top portion of the gate electrodes from the silicides of the same metal, a simplified fabrication process as well as a stable and low-resistance gate electrode line structure can be obtained, In the semiconductor device of the above example, silicides having different compositions and configuring the second gate electrode for the N-type MOSFET and first gate electrode for the P-type MOSFET are connected via the impurity-doped region provided on the device isolation area. In the impurity-doped region including impurities at a high concentration, the bidirectional diffusion of the gate electrode materials (metal, silicon, etc.) is extremely suppressed, whereby it is possible to prevent composition change of the silicides which configure the gate electrode materials. That is, it is possible to provide a stable interface on the device isolation area. As a result, it is possible to provide silicide gate electrodes having a uniform and stable composition as the gate electrodes for the N-type MOSFET and P-type MOSFET. In addition, due to the improved device stability with respect to the manufacturing process, the range of variation in the device performance can be reduced. Thus, it is possible to obtain a semiconductor device having a uniform composition for the gate electrode and gate insulation film, having higher performance and reliability, having a desired controlled Vth without degradation of the reliability, and operating at a higher speed with a lower power dissipation.

In the manufacturing process of the above example, since the impurity-doped region including impurities at a high concentration and provided on the device isolation area is formed by ion implantation prior to full silicidation, the manufacturing process can be simplified. Since the conventional impurity implantation technique can be used, the development cost of the process can be suppressed to a minimum.

As described above, the present invention may employ the following embodiments, for example.

The impurities included in the impurity-doped silicon region include boron, arsenic, phosphor or antimony, for example. The concentration of the impurities in the impurity-doped region is not less than $1 \times 10^{20}$ cm$^{-3}$, for example.

The silicide of metal M1 and silicide of metal M2 may be of a silicide crystal phase having a stoichiometric composition. For example, the silicide of metal M1 May be M1$_x$Si$_{1-x}$ (x>0.5), and the silicide of metal M2 may be M2$_y$Si$_{1-y}$ (y≦0.5). The metals M1 and M2 may be of the same metallic element. For example, the metals M1 and M2 are nickel (Ni).

The silicide of metal M1 may be of a Ni$_2$Si crystal phase or Ni$_3$Si crystal phase, and the silicide of metal M2 may be of a NiSi crystal phase or NiSi$_2$ crystal phase.

The first and second silicide regions may be in contact with the gate insulation film, and the gate insulation film may be a higher-permittivity insulation film. In an alternative, a configuration may be employed wherein the gate insulation film includes a higher-permittivity insulation film in contact with the first and second silicide regions, and a silicon oxide film or a silicon oxynitride film underlying the higher-permittivity insulation film. The higher-permittivity insulation film may include one of a metal oxide, a metal silicate, and a metal oxide or metal silicate that includes therein doped nitrogen. In an alternative, the higher-permittivity insulation film may include therein Hf or Zr Further, the higher-permittivity insulation film may include therein HfSiON.

In the semiconductor device of the present invention, an NMOSFET and a PMOSFET may configure a CMOSFET. The first and second gate electrodes may further include a low-resistance film as a topmost layer on the surface far from the gate insulation film, and include the first and second silicide regions underlying the low-resistance film. The first gate electrode may include the low-resistance film including a NiSi crystal phase, and the first silicide regions including a Ni$_2$Si crystal phase or Ni$_3$Si crystal phase as the silicide of metal M1, and the second gate electrode may include the low-resistance film including a NiSi crystal phase, and a NiSi$_2$ crystal phase. The first and second gate electrodes may include a low-resistance film as the topmost layer, and the first and second silicide regions underlying the low-resistance film.

While the invention has been particularly described with reference to examples thereof, the invention is not limited to these examples, and various changes and modifications may fall within the scope of the present invention For example, the species of the impurities implanted into the polysilicon gate pattern on the device isolation area is not limited to antimony, the species and dosage of the impurities may be optimized depending on the development of the fabrication process of the device, so long as the junction surface between the silicides having different compositions is maintained with a stability. In addition, the different crystal phases may be formed in the full-silicidation process, so long as the contact resistance of the source/drain regions and impurity concentration profile of the diffused regions are not degraded. Further, the Ni is not the only material for the silicide, so long as a silicide layer having a sufficiently lower resistivity can be formed therefrom on the silicide layer configuring the gate electrodes.

This application is based upon and claims the benefit of priority from Japanese patent application No. 2006-16915 filed on, Jun. 19, 2006, the disclosure of which is incorporated herein in its entirety by reference.

The invention claimed is:

1. A semiconductor device comprising:
   a semiconductor substrate,
   a device isolation area that isolates a surface portion of said semiconductor substrate into a P-type area and an N-type area;
   a gate electrode line that extends on said device isolation area, P-type area and N-type area, and is insulated from said P-type area and N-type area by a gate insulation film;
   source/drain diffused regions formed in each of said P-type area and N-type area to sandwich therebetween said gate electrode line, wherein:
   said gate electrode line includes a first silicide region formed on said N-type area and including a silicide of metal M1, a second silicide region formed on said P-type area and including a silicide of metal M2, and an impurity-doped silicon region formed on said device isolation area to separate said first silicide region and said second silicide region from each other.

2. The semiconductor device according to claim 1, wherein impurities included in said impurity-doped silicon region include boron, arsenic, phosphor or antimony.

3. The semiconductor device according to claim 1, wherein concentration of said impurities in said impurity-doped silicon region is not less than $1 \times 10^{20} cm^{-3}$.

4. The semiconductor device according to claim 1, wherein said silicide of metal M1 and said silicide of metal M2 are of a silicide crystal phase having a stoichiometric composition.

5. The semiconductor device according to claim 1, wherein said silicide of metal M1 is $M1_x Si_{1-x}$ (x>0.5), and said silicide of metal M2 is $M2_y Si_{1-y}$ (y≦0.5).

6. The semiconductor device according to claim 5, wherein said metals M1 and M2 are of the same metallic element.

7. The semiconductor device according to claim 6, wherein said metals M1 and M2 are nickel (Ni).

8. The semiconductor device according to claim 7, wherein said silicide of metal M1 is of a $Ni_2Si$ crystal phase or $Ni_3Si$ crystal phase.

9. The semiconductor device according to claim 7, wherein said silicide of metal M2 is of a NiSi crystal phase or $NiSi_2$ crystal phase.

10. The semiconductor device according to claim 1, wherein said gate insulation film is a higher-permittivity insulation film.

11. The semiconductor device according to claim 1, wherein said gate insulation film includes a higher-permittivity insulation film in contact with said first and second silicide regions, and a silicon oxide film or a silicon oxynitride film underlying said higher-permittivity insulation film.

12. The semiconductor device according to claim 10, wherein said higher-permittivity insulation film includes one of a metal oxide, a metal silicate, and a nitride of metal oxide or metal silicate.

13. The semiconductor device according to claim 10, wherein said higher-permittivity insulation film includes therein Hf or Zr.

14. The semiconductor device according to claim 10, wherein said higher-permittivity insulation film includes therein HfSiON.

15. The semiconductor device according to claim 1, wherein an NMOSFET and a PMOSFET which are formed in said P-type area and N-type area, respectively, configure a CMOSFET.

16. The semiconductor device according to claim 1, wherein said gate electrode line further includes a low-resistance film formed on said first and second silicide regions and said impurity-doped silicon region.

17. The semiconductor device according to claim 16, wherein said low-resistance film includes a NiSi crystal phase, said silicide of metal M1 includes a $Ni_2Si$ crystal phase or $Ni_3Si$ crystal phase, and said silicide of metal M2 includes a $NiSi_2$ crystal phase.

18. A method for manufacturing a semiconductor device comprising:
    forming a gate insulation film on a semiconductor substrate, a surface portion of which is isolated by a device isolation area into an N-type area and a P-type area;
    forming a gate electrode pattern including therein silicon on said device isolation area and said gate insulation film;
    forming source/drain regions on both sides of said gate electrode pattern in said N-type area and P-type area;
    forming an interlayer dielectric film that exposes therethrough said gate electrode pattern and covers said source/drain regions;
    selectively implanting impurities into a portion of said gate electrode pattern on said device isolation area, to form an impurity-doped silicon section;
    reacting silicon of a portion of said gate electrode pattern on said N-type area with a metal M1, to form a first silicide region; and
    reacting silicon of a portion of said gate electrode pattern on said P-type area with a metal M2, to form a second silicide region.

19. The method for manufacturing a semiconductor device according to claim 18, wherein said metal M1 and said metal M2 are nickel (Ni), said first silicide region (8) includes a $Ni_2Si$ crystal phase or $Ni_3Si$ crystal phase, and said second silicide region includes a $NiSi_2$ crystal phase,
    said method further comprising:
    depositing a Si film on said first silicide region, and reacting said Si film with said $Ni_2Si$ crystal phase or $Ni_3Si$ crystal phase included in said first silicide region in a heat treatment, to form a low-resistance film including a NiSi crystal phase in a top portion of said first silicide region; and
    depositing a Ni film on said second silicide region, and reacting said Ni film with said $NiSi_2$ crystal phase included in said second silicide region in a heat treatment, to form a low resistance film including a NiSi crystal phase in a top portion of said second silicide region.

* * * * *